US008400446B2

(12) United States Patent
Gatzke et al.

(10) Patent No.: US 8,400,446 B2
(45) Date of Patent: Mar. 19, 2013

(54) METHOD AND APPARATUS FOR PLACING FASTENERS IN A MODEL-BASED DEFINITION

(75) Inventors: Timothy D. Gatzke, St. Charles, MO (US); Francis P. Delaney, Gelen Mills, PA (US); Philip H. Farcy, Ashford, WA (US); Thomas A. Schwarting, Aston, PA (US); Nancy Schwarting, legal representative, Aston, PA (US)

(73) Assignee: The Boeing Company, Chicago, IL (US)

( * ) Notice: Subject to any disclaimer, the term of this patent is extended or adjusted under 35 U.S.C. 154(b) by 1589 days.

(21) Appl. No.: 11/559,622

(22) Filed: Nov. 14, 2006

(65) Prior Publication Data

US 2008/0111813 A1  May 15, 2008

(51) Int. Cl.
  *G06T 15/00* (2006.01)
  *G09G 5/00* (2006.01)
(52) U.S. Cl. ........................................ 345/419; 345/619
(58) Field of Classification Search .................. 345/419, 345/619
  See application file for complete search history.

(56) References Cited

U.S. PATENT DOCUMENTS

| 5,689,435 | A  | * | 11/1997 | Umney et al. ..................... 703/1 |
| 6,219,049 | B1 | * | 4/2001 | Zuffante et al. ................ 715/764 |
| 6,597,355 | B1 | * | 7/2003 | Kulkarni ........................ 345/420 |
| 6,792,397 | B2 | * | 9/2004 | Yoshikawa et al. ............... 703/2 |
| 7,079,990 | B2 |   | 7/2006 | Haller et al. |
| 7,353,609 | B2 | * | 4/2008 | Hollingshead et al. ......... 33/1 G |
| 7,479,959 | B2 | * | 1/2009 | Han et al. ....................... 345/420 |
| 2001/0034590 | A1 | * | 10/2001 | Onodera et al. .................... 703/2 |
| 2003/0187879 | A1 | * | 10/2003 | Tamaru et al. ............. 707/104.1 |
| 2006/0069462 | A1 | * | 3/2006 | Cannedy et al. ............... 700/180 |
| 2006/0106483 | A1 | * | 5/2006 | Behan et al. .................. 700/180 |
| 2007/0011496 | A1 | * | 1/2007 | Ahmad et al. .................. 714/39 |
| 2007/0106409 | A1 | * | 5/2007 | Anelle ........................... 700/97 |

FOREIGN PATENT DOCUMENTS

EP         1923761 A2      5/2008

OTHER PUBLICATIONS

Jankowski, "Using the Hole Wizard", http://www.cadalyst.com/cad/solidworks/using-hole-wizard-9798, Feb. 16, 2004.*
EP search report dated Dec. 22, 2011 regarding application 07120733.6, applicant The Boeing Company, 9 Pages.
Kashyap, "A Feature-Based Framework for Attachment Level Snap-Fastener Design in Product Design for Automated Assembly," Proceedings of the 1999 IEEE International Symposium on Assembly and Task Planning, Jul. 1999, 3 Pages.
Knoche, "Embrace Model Based Definition," Aerospace, Quality Magazine, Jul. 2006, 4 Pages.
Korneffel, "Digital Fastener Library Simplifies New Fastener Standard," Fastener Technology International, Jun. 2006, 2 Pages.
Petteur-Lloyd et al., "Designing in SolidWorks," LIGO Project, Institute for Graviational Research, Aug. 2003, pp. 1-32.

* cited by examiner

*Primary Examiner* — Jeffrey Chow
(74) *Attorney, Agent, or Firm* — Yee & Associates, P.C.

(57) ABSTRACT

A computer implemented method, apparatus, and computer usable program code for placing fasteners in a three dimensional product definition. A fastener is identified from a plurality of different fasteners to fasten a set of components in a three dimensional product definition using a policy to form a selected fastener. A set of points on the set of components is received for which fasteners are to be placed to form a set of defined points. A set of locations in the set of components is generated in the three dimensional product definition using the set of defined points to form a set of defined locations. The selected fastener is placed into the set of defined locations.

21 Claims, 20 Drawing Sheets

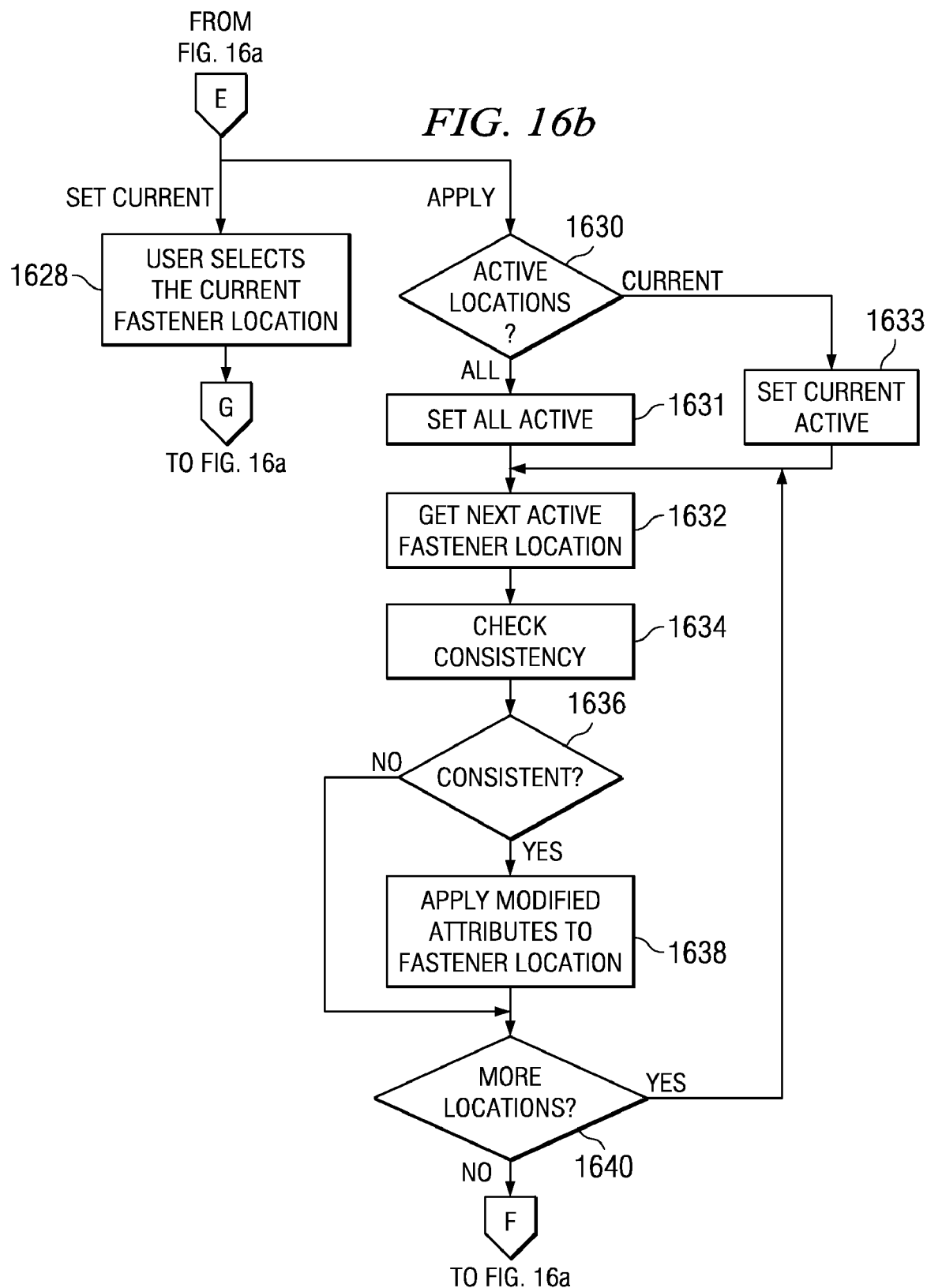

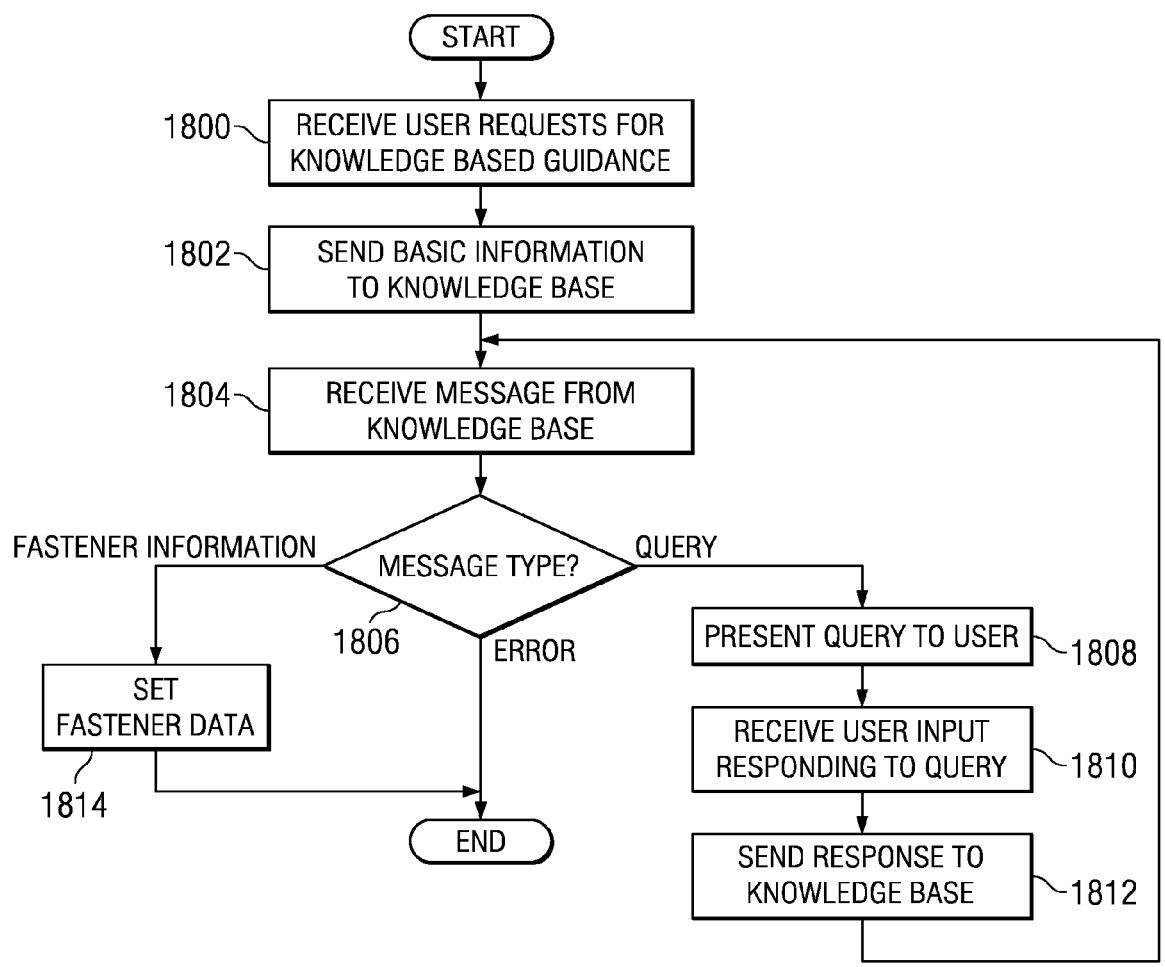

METHOD AND APPARATUS FOR PLACING FASTENERS IN A MODEL-BASED DEFINITION

BACKGROUND INFORMATION

1. Field of Invention

The present invention relates generally to an improved data processing system and in particular to a method and apparatus for processing design data. Still more particularly, the present invention relates to a computer implemented method, apparatus, and computer usable program code for generating a model-based definition containing fasteners used to couple components.

2. Background Description

The design of aerospace vehicles involves using computer aided design (CAD) environments to generate product definitions for vehicles, such as aircraft and space vehicles. A product definition contains one or more parts and/or assemblies that are represented in electronic form. A product definition may be stored in a single electronic file or be spread across multiple electronic files. The electronic files generated by computer aided design systems are technical drawings of one or more components using a computer. In designing vehicles and components for these vehicles, the designs are moving towards using three dimensional model-based definition (MBD). Model-based definition is a new trend for creating three dimensional product definitions using computer aided design.

In current designs without model-based definition, all three dimensional computer aided design product definitions have an accompanying two dimensional drawing. This two dimensional drawing is used to show specific information about the three dimensional product definition, such as dimensions and tolerances, and provide annotations. This information is meant to convey engineering intent (EI), which communicates the designer's intention for how a product should be fabricated, assembled, operated and maintained, to the personnel who will fabricate, assemble, operate, and maintain the product. The three dimensional product definition does not show these types of details.

As a result, duplication of effort and contradictions between the original three dimensional product definition and the two dimensional derivative may occur. With model-based definition, engineering intent, such as dimensions, annotations, and other associated information, is directly inserted into the three dimensional product definition, eliminating the need for additional drawings.

With a model-based approach to computer aided design, tools and processes are required to efficiently generate product definitions and capture the engineering intent for the different designs. In addition, different design tasks often manage project data in different ways and have different requirements for the use of standard parts, such as fasteners.

Current computer aided design systems provide capabilities for construction of detailed parts and assemblies. However, the specification of large amounts of fastener hardware in these three dimensional designs is a labor intensive process and provides a potential source of modeling error.

Therefore, it would be advantageous to have an improved fastener placement tool in which productivity is increased and errors are decreased.

SUMMARY OF THE INVENTION

An embodiment of the present invention provides a computer implemented method, apparatus, and computer usable program code for placing fasteners in a three dimensional product definition. A fastener is identified from a plurality of different fasteners to fasten a set of components in a three dimensional product definition using a policy to form a selected fastener. A set of points on the set of components is received for which fasteners are to be placed to form a set of defined points. A set of locations in the set of components is generated in the three dimensional product definition using the set of defined points to form a set of defined locations. The selected fastener is placed into the set of defined locations.

In another embodiment of the present invention, a first user input selecting a fastener to fasten a set of components in a three dimensional product definition to form a selected fastener is received. The three dimensional product definition uses model-based definition in which parameters describing components are included in the three dimensional product definition. A second user input defining a point on the set of components in the three dimensional product definition to form a defined point is received, wherein the defined point is a point at which the fastener is to be inserted. Whether the selected fastener is acceptable for use in fastening the set of components is determined utilizing a policy. A breakout point is identified on the set of components using the defined point to form a location for the fastener, in response to a determination that the selected fastener is acceptable. The breakout point is a particular point along a vector, originating from the defined point, at which the vector exits the set of components. The selected fastener is placed into the location.

In yet another embodiment of the present invention, a fastener is identified from a plurality of different fasteners to fasten a set of components in a three dimensional product definition using a policy to form a selected fastener. A set of points on the set of components is received for which fasteners are to be placed to form a set of defined points. A set of locations in the set of components in the three dimensional product definition using the set of defined points is generated to form a set of defined locations. The selected fastener is placed into the set of defined locations.

The features, functions, and advantages can be achieved independently in various embodiments of the present invention or may be combined in yet other embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an advantageous embodiment of the present invention when read in conjunction with the accompanying drawings, wherein:

FIGS. 16A and 16B are flowcharts of a process for editing attributes in accordance with an advantageous embodiment of the present invention;

FIG. 18 is a flowchart of a process for knowledge based guidance in accordance with an advantageous embodiment of the present invention.

DETAILED DESCRIPTION OF THE INVENTION

Figure 1:
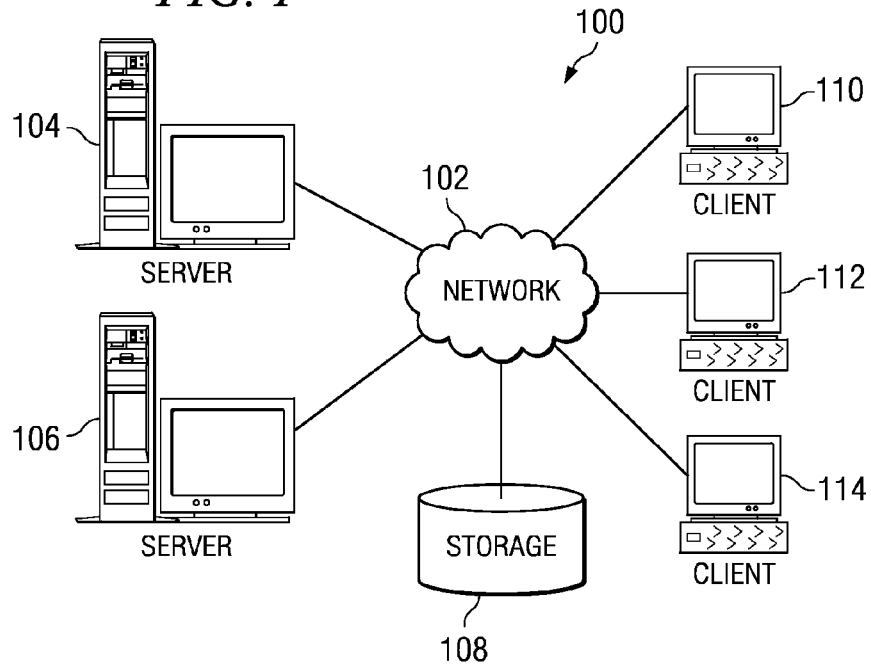
FIG. 1 depicts a pictorial representation of a network of data processing systems in accordance with an advantageous embodiment of the present invention.
Figure 2:
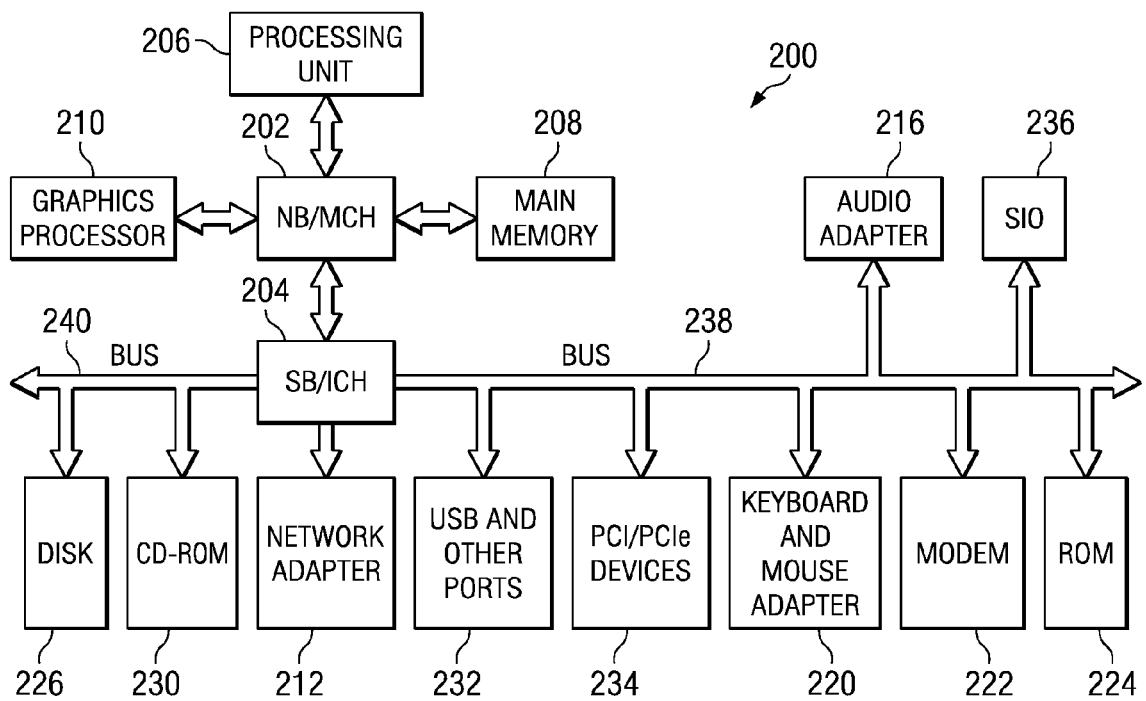
FIG. 2 is a block diagram of a data processing system in accordance with an advantageous embodiment of the present invention.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

With reference now to the figures, FIG. 1 depicts a pictorial representation of a network of data processing systems in which illustrative embodiments may be implemented. Network data processing system 100 is a network of computers in which embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. These clients 110, 112, and 114 may be, for example, personal computers or network computers. In the depicted example, server 104 provides data, such as boot files, operating system images, and applications to clients 110, 112, and 114.

In these illustrative embodiments, clients 110, 112, and 114 may be workstations for use in representing and placing fasteners in designs. In particular, the representation and placement of fasteners are made in model-based definition (MBD) designs. Model-based definition designs are a type of computer aided design file in which all of the information for the design are included with the design. In the illustrative embodiments, the designs are three dimensional model-based definition designs. With these types of designs, the information about the different parts making up a design are included in the three dimensional design and do not require a separate two dimensional drawing. Specifications, fastener hardware information, fastener models, policies for applying fasteners to product definitions, and other information may be located at a server, such as server 104 or 106.

Depending on the implementation, clients 110, 112, and 114 may function as terminals with the processes for placing fasteners being located at the servers. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for different embodiments.

With reference now to FIG. 2, a block diagram of a data processing system is shown in which illustrative embodiments may be implemented. Data processing system 200 is an example of a computer, such as server 104 or client 110 in FIG. 1, in which computer usable code or instructions implementing the processes may be located for the illustrative embodiments.

In the depicted example, data processing system 200 employs a hub architecture including a north bridge and memory controller hub (MCH) 202 and a south bridge and input/output (I/O) controller hub (ICH) 204. Processing unit 206, main memory 208, and graphics processor 210 are coupled to north bridge and memory controller hub 202. Processing unit 206 may contain one or more processors and even may be implemented using one or more heterogeneous processor systems. Graphics processor 210 may be coupled to the MCH through an accelerated graphics port (AGP), for example.

In the depicted example, local area network (LAN) adapter 212 is coupled to south bridge and I/O controller hub 204 and audio adapter 216, keyboard and mouse adapter 220, modem 222, read only memory (ROM) 224, universal serial bus (USB) ports and other communications ports 232, and PCI/PCIe devices 234 are coupled to south bridge and I/O controller hub 204 through bus 238, and hard disk drive (HDD) 226 and CD-ROM drive 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be coupled to south bridge and I/O controller hub 204.

An operating system runs on processing unit 206 and coordinates and provides control of various components within data processing system 200 in FIG. 2. The operating system may be a commercially available operating system such as Microsoft Windows® XP (Microsoft and Windows are trademarks of Microsoft Corporation in the United States, other countries, or both). An object oriented programming system, such as the Java™ programming system, may run in conjunction with the operating system and provides calls to the operating system from Java™ programs or applications executing on data processing system 200. Java™ and all Java-based trademarks are trademarks of Sun Microsystems, Inc. in the United States, other countries, or both.

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system. In some illustrative examples, data processing system 200 may be a personal digital assistant (PDA), which is generally configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in north bridge and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

The different embodiments recognize that currently, the user places the fastener in the hole by identifying the correct position for the fastener in the three dimensional design. Additionally, the user also is currently required to determine the appropriate length needed for the fastener as well as other components needed to place the fastener in the hole. For example, the user selects a fastener, such as a bolt along with a washer, and a nut to place the fastener. The fastener must have the appropriate diameter as well as the appropriate length for the hole that has been created by the user.

The advantageous embodiments of the present invention provide a computer implemented method, apparatus, and computer usable program code to place fasteners in a three dimensional design using model-based definition (MBD). A fastener is identified from a number of types of fasteners for use to fasten a set of components in a three dimensional product definition using a policy for a selected type of fastener. A set of points is defined on the set of components for which fasteners are to be placed to form a set of defined points. A set of locations is generated in the set of components in the three dimensional product definition using the set of defined points to form a set of defined locations. Fasteners are placed into the set of defined locations.

The type of fastener may be identified through a user input selecting a type of fastener from a number of different types presented for selection. Additionally, the set of points may be received by a user selecting points on the components.

In generating the set of locations, a breakout point on the set of components is identified using a defined point from the set of points to form a location for the fastener. The breakout point is a particular point along a vector, originating from the defined point, at which the vector exits the set of components. In other words, the defined point is on one surface of the set of components and the breakout point is a point on another surface of the components. The face of the component at which the breakout point is located is referred to as the breakout face in these examples. A line or segment connecting those points forms a location. In other words, the location is where the hole should be placed for the fastener in these examples. In these examples, the three dimensional product definition uses model-based definition in which parameters describing the components are included in the three dimensional product definition.

The user selects a fastener from a list or set of fasteners. When user input selecting a location to fasten a set of components using the selected fastener is received, a determination is made as to whether the selected fastener is appropriate in fastening the set of components at that location using a policy. This policy also may be found on a remote source from the tool used to generate the fasteners for the three dimensional product definition. In this manner, a consistency check for the compatibility for making different components and the holes for those components with fasteners is handled through a uniform policy.

In response to a determination that the fastener is appropriate for use in fastening the set of components at the location, the fastener is added to a three dimensional product definition. Otherwise, an error is returned or presented to the user. Depending on the implementation, the user may select or input a particular component with that component being retrieved for use in the design.

In some illustrative embodiments, the selection of fasteners is managed by providing a list or set of fasteners that the user may employ. This selection of fasteners is maintained in an external or remote location to the data processing system on which the design is being created or modified in these examples. In this manner, the same set of fasteners may be used for designing product definitions at different data processing systems. This central storage of information allows for uniformity and easier updating of fastener information. Each computer does not have to be updated and inconsistent or incorrect fastener information at a station is avoided.

The different embodiments of the present invention also reduce the amount of time needed to place fasteners in a design through a process that automatically places fasteners in response to a user designating points for fasteners. For example, a user may place points at different locations in the design. In response to a selection of the points, the process in these illustrative examples creates locations for the fasteners. In other words, the appropriate hole through the surface of the components is generated. The process places fasteners in the correct positions within the three dimensional design. The process also may include parameters, such as the appropriate length for a fastener based on the components through which a hole is selected. A user may create or place holes in a design.

Additionally, the different embodiments control access to different tool options that may be used. In these examples, an external source may be used to identify information, such as, for example, standards, part details, models, and part lists. Further, the different embodiments allow for coordinated management of holes and tolerances along with fastener hardware to reduce the potential for fastener incompatibilities. The access control in the illustrative embodiments allow flexibility in project choices as new capabilities become available while restricting the use of non-approved techniques where those non-approved techniques could compromise project guidelines and increase the burden for verification.

Figure 3:
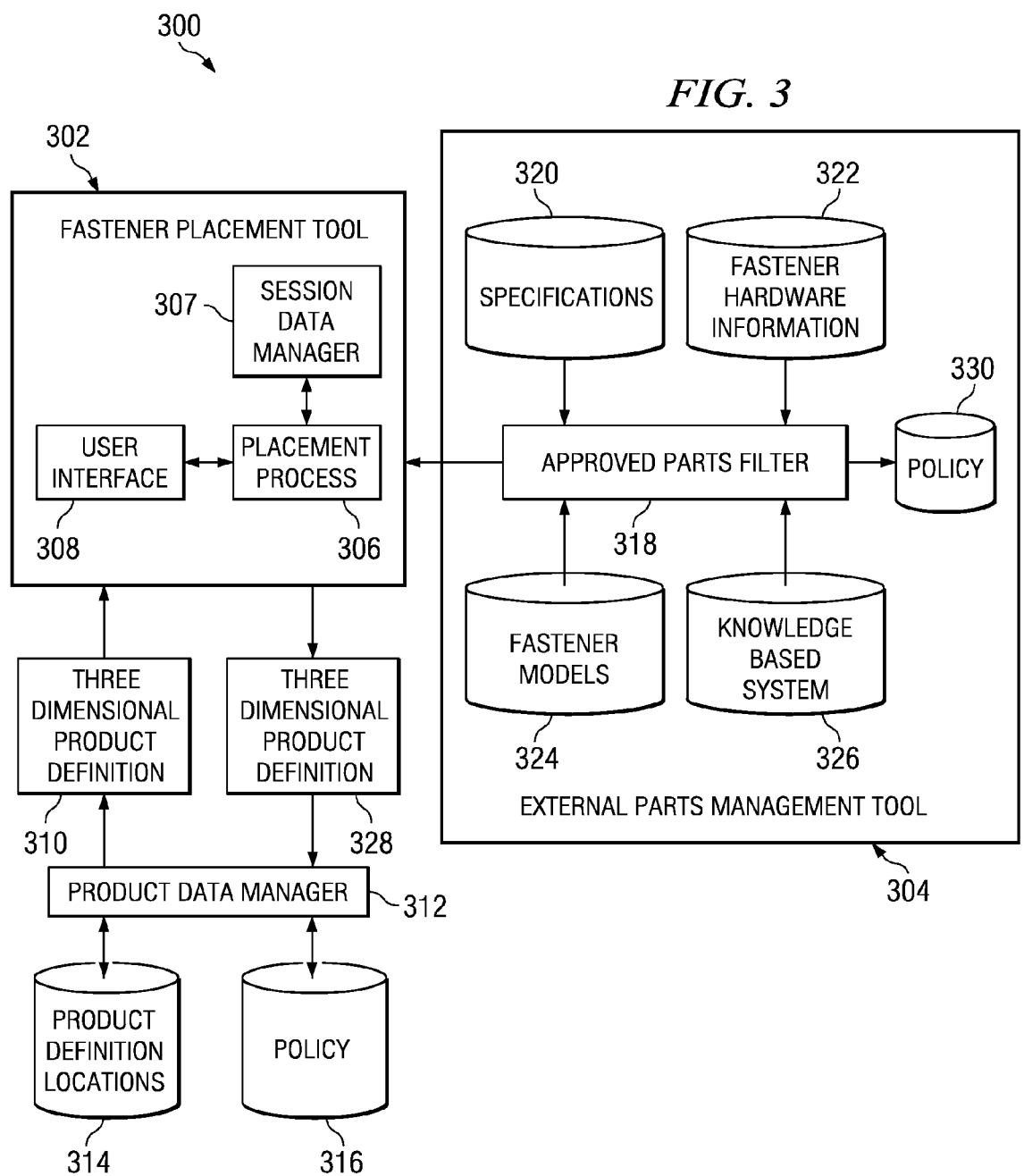
FIG. 3 is a diagram of components used in providing fastener representation and placement in a three dimensional product definition using model-based definition in accordance with an advantageous embodiment of the present invention.

Turning now to FIG. 3, a diagram of components used in providing fastener representation and placement in a three dimensional product definition using model-based definition is depicted in accordance with an advantageous embodiment of the present invention. In this illustrative example, fastener system 300 includes fastener placement tool 302 and external parts management tool 304. Fastener placement tool 302 may be implemented in a data processing system, such as client 110, 112, or 114 in FIG. 1. External parts management tool 304 may be implemented using server 104 or 106 in FIG. 1.

In these particular examples, fastener placement tool 302 may be software that is useable in a stand alone form to place fasteners in a three dimensional design. Alternatively, fastener placement tool 302 may be a module that may be used within a computer aided design environment. An example of such an environment is CATIA V5R17, which is available from Dassault Systemes.

In this example, fastener placement tool 302 includes placement process 306, session data manager 307, and user interface 308. User interface 308 provides an interface for a user to interact with fastener placement tool 302. Through user interface 308, a user may select a product definition, such as three dimensional product definition 310, for placing fasteners. Three dimensional product definition 310 is a computer aided design product definition using model-based definition in these examples. With model-based definition, information about the different parts or components are included in a three dimensional design. Information, such as, for example, specifications, fastener hardware information, fastener models, policies for applying fasteners to product definitions, and other information may be included. In addition to attributes about the components, other information may be included with a three dimensional product definition. For example, a tolerance of a hole for a fastener, the torque required to install a fastener and other installation requirements may be specified in a three dimensional product definition. The tolerance for a hole defines the minimum and maximum acceptable diameter for the hole. Other information included may be, for example, if the fasteners are to be wet installed with a sealant.

Three dimensional product definition 310 may be for various aerospace vehicle designs in these examples. For example, three dimensional product definition 310 may represent a part containing two or more components, a sub-assembly, or even an entire aerospace vehicle. In this example, three dimensional product definition 310 is obtained from product data manager 312.

Fastener placement tool 302 sends a request to product data manager 312 for three dimensional product definition 310. Product data manager 312, in turn, identifies the location of the file or files, or the data structure, containing the product definition. For example, three dimensional product definition 310 may be located in product definition locations 314, which is a database of product definitions. This database may be located in one or more different locations. In this manner, the user of fastener placement tool 302 does not need to know the location of three dimensional product definition 310.

The storage and retrieval of product definitions, such as three dimensional product definition 310, is handled by product data manager 312 which tracks the locations and determines an appropriate location to store the product definitions using policy 316. Policy 316 is a set of rules that govern where product definitions are stored. Policy 316 may allow a user to designate a location for storing a product definition.

Alternatively, policy 316 may designate that product definitions for a certain project are to be stored in a particular location. In these examples, a project is associated with the design activity for a particular aerospace vehicle, assembly, sub-assembly, or part. Different projects may have different constraints on what parts, such as fasteners, may be used.

Product definition locations 314 is a database identifying where different product definitions, such as three dimensional product definition 310, are located. Product data manager 312 uses product definition locations 314 to retrieve three dimensional product definition 310 for use by fastener placement tool 302. In these examples, product definition locations 314 includes a path, link, or some other location identifier to the location of a particular three dimensional product definition. Product definition file names are used to index or identify the particular product definitions. Additionally, product definitions within product definition locations 314 may be associated with projects. In this manner, a user may see a selection of product definitions available for a particular project.

Session data manager 307 is a local repository for data used during the session. For example, when project specific options are loaded or lists of fasteners are processed, the resulting data is saved in session data manager 307. Operations that need data first check to see whether that data is available locally in session data manager 307. Session data manager 307 provides the information if that information is available. If the information is not available from session data manager 307, the operation will obtain the information from an alternate source or process.

Placement process 306 provides the different processes used to select a fastener for placement within a location to join or fasten a set of components to each other. In these examples, a set of components are two or more components. For example, a fastener may join two or three components together at a location in which a hole is to be placed for the fastener. Placement process 306 also determines whether the fastener can be placed at the location to join the set of components as selected by the user.

In performing this function, placement process 306 includes a process to check for consistency of hardware. The consistency check may include, for example, determining whether the hole tolerance matches the fastener diameter and whether fastener mating parts are allowed to be used for the particular components and location. These mating parts may be, for example, a bolt, a nut, and a washer. Additionally, placement process 306 may provide a selection of hardware options. In particular, these hardware options are different fasteners that may be used.

Further, placement process 306 also provides for automatic calculation of parameters, such as, for example, fastener axis orientation, fastener grip length, and the diameter of a fastener. In this manner, the different decisions and calculations made currently by a user are eliminated.

The user in these illustrative embodiments selects a point for a fastener, such as placing a point on a surface of a component in a set of components that are to be fastened to each other. In other words, placement process 306 identifies a location for the fastener. In identifying the location, placement process 306 identifies a hole that needs to be created through the set of components.

In these illustrative examples, a hole is not actually generated in the product definition. Instead, the fastener is placed into the product definition and information about the hole may be stored along with the fastener hardware information. For example, a hole ID number, hole diameter, hole tolerance, and whether a countersink is required for the hole can be specified. This information about the hole may be stored with the fastener hardware information. Of course, in other embodiments, a hole may actually be created. This feature may be useful in an instance in which fasteners are not placed into the components at that point, but users desire to include a geometric representation for the hole within the design. The actual placement of a model for a fastener and other specifications needed for the fastener are automatically placed into the design by placement process 306 in these illustrative embodiments.

In these examples, the geometric representation for holes and fasteners may be useful for certain functions such as visualization, but is not required for defining the holes. The fasteners and holes are defined sufficiently by the fastener data placed in the product definition apart from their geometric representation.

In selecting fasteners, the different fasteners that may be used and how those fasteners may be used with respect to different locations and types of components are defined using information from external parts management tool 304. This component includes approved parts filter 318, which is a process that controls information from specifications 320, fastener hardware information 322, fastener models 324, and knowledge based system 326. Approved parts filter 318 may receive requests from placement process 306 and provide responses as to what parts may be used based on the sources of information.

Fastener hardware information 322 contains the different attributes for fasteners. Hardware in the context of fasteners refers to any item associated with a fastener's installation. These items located in fastener hardware information 322 may include, for example, fastener hardware, mating hardware, and spacer hardware. Fastener hardware may be, for example, a fastener such as a bolt, pin, rivet, or screw. Mating hardware includes items that are used to anchor a fastener in place, such as a nut or a collar. A spacer is a hardware item that fills in space for the fastener installation. A spacer may be, for example, a washer, a bearing, or a bushing.

This information may be obtained from current specifications for fasteners available through different manufacturers. These specifications may include, for example, the material used to make the fastener, the type of head for the fastener, the maximum length of a fastener, available thread diameters, and the length of the thread.

Fastener hardware information 322 provides a central location to store this information. Of course the information contained in fastener hardware information 322 may differ depending on the particular implementation.

Fastener models 324 contains electronic files for the three dimensional fastener representations that may be used by fastener placement tool 302 to place a selected fastener into a design. In other words, fastener models 324 contains three dimensional designs for the different fasteners that may be used.

In the illustrative embodiments, knowledge based system 326 is a system that aids a user in decision making by using available information and queries the user for additional information as required to recommend a course of action. In these examples, knowledge based system 326 may be used to aid a user in selecting a specific fastener if the user is unsure of what fastener to use. Knowledge based system 326 contains information and rules that may be used to guide a user in selecting a particular type of fastener if the user is unsure of what fastener to use. For example, fastener placement tool 302 may use knowledge based system 326 to ask the user a set of questions to help the user identify an appropriate fastener.

Policy 330 includes policies to identify what fasteners are appropriate for different projects. For example, if the project is for a new aircraft, only certain fasteners may be used for this particular aircraft. As an example, if the aircraft is a military aircraft, only fasteners that meet certain military specifications may be used. Approved parts filter 318 responds to requests from fastener placement tool 302 for fastener models and information. In these examples, policy 330 may include or take the form of key files, which contains information as to what fasteners may or may not be used.

Placement process 306 uses the information from external parts management tool 304 and user input received through user interface 308 to generate three dimensional product definition 328, which is a modified version of three dimensional product definition 310. This modified product definition contains fasteners in locations selected by the user.

When the user is finished working with a design, fastener placement tool 302 sends three dimensional product definition 328 back to product data manager 312. In response, product data manager 312 stores three dimensional product definition 328 in a location. This location may be the same location from which the unmodified version of the product definition was retrieved or a different location. If the location or file name changes, product definition locations 314 is updated with this information.

Figure 4:
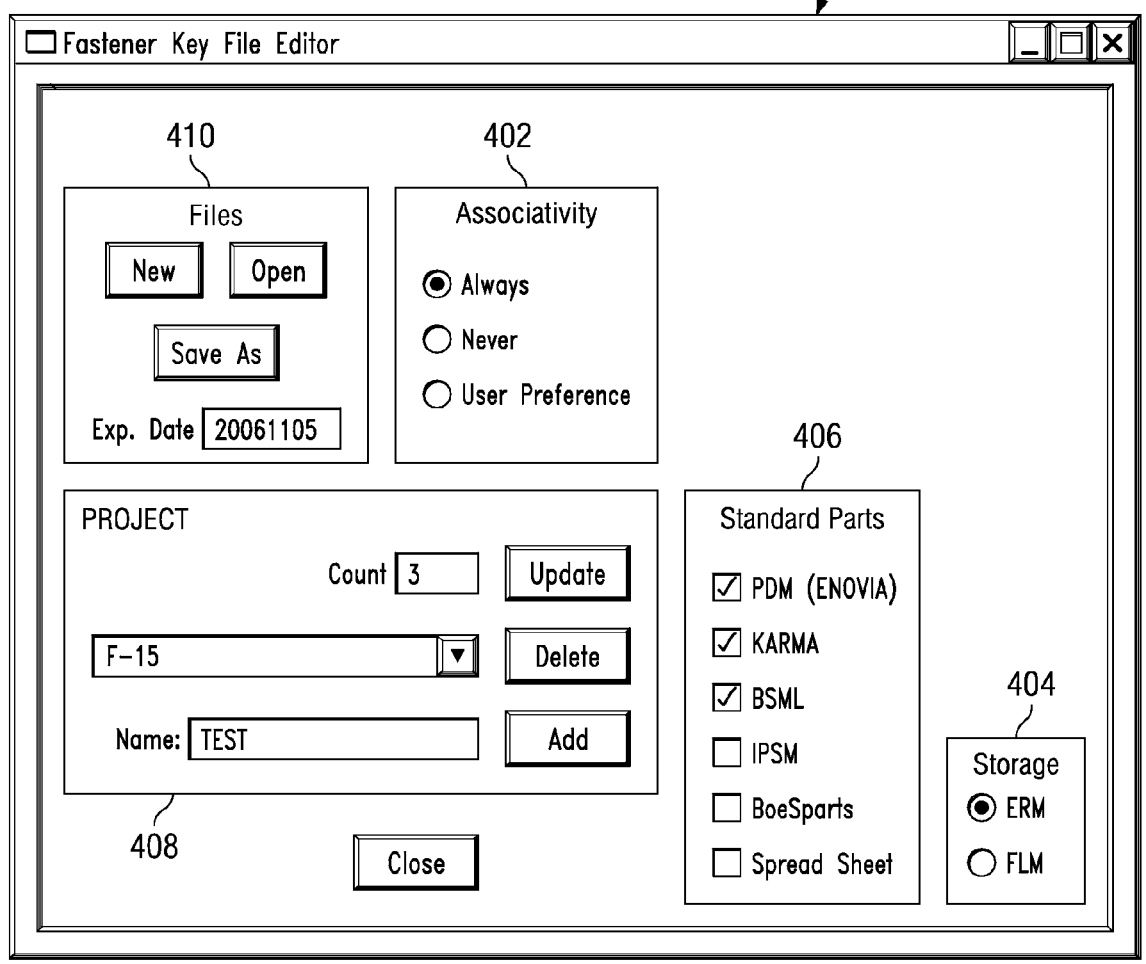
FIG. 4 is a diagram illustrating a key file editor dialog in accordance with an advantageous embodiment of the present invention.

Turning now to FIG. 4, a diagram illustrating a key file editor dialog is depicted in accordance with an advantageous embodiment of the present invention. In this example, dialog 400 is an example of a dialog that may be presented in user interface 308 in FIG. 3. Section 402 is used to determine whether fasteners will be associative. A user may select always, never, or user preference in this example. Section 404 is used to identify storage for the design. In these examples, the storage is collector data type, which may be ERM or FLM in these examples.

Section 406 in dialog 400 allows a user to set options for standard part sources. A user may select one or more standard parts options from this list in section 406 for use in fastening components. Section 408 allows a user to select or add projects. Section 410 is used to create a new file, open an existing file, or save a file. Further, section 410 also allows a user to input an expiration date for the key file.

Figure 5:
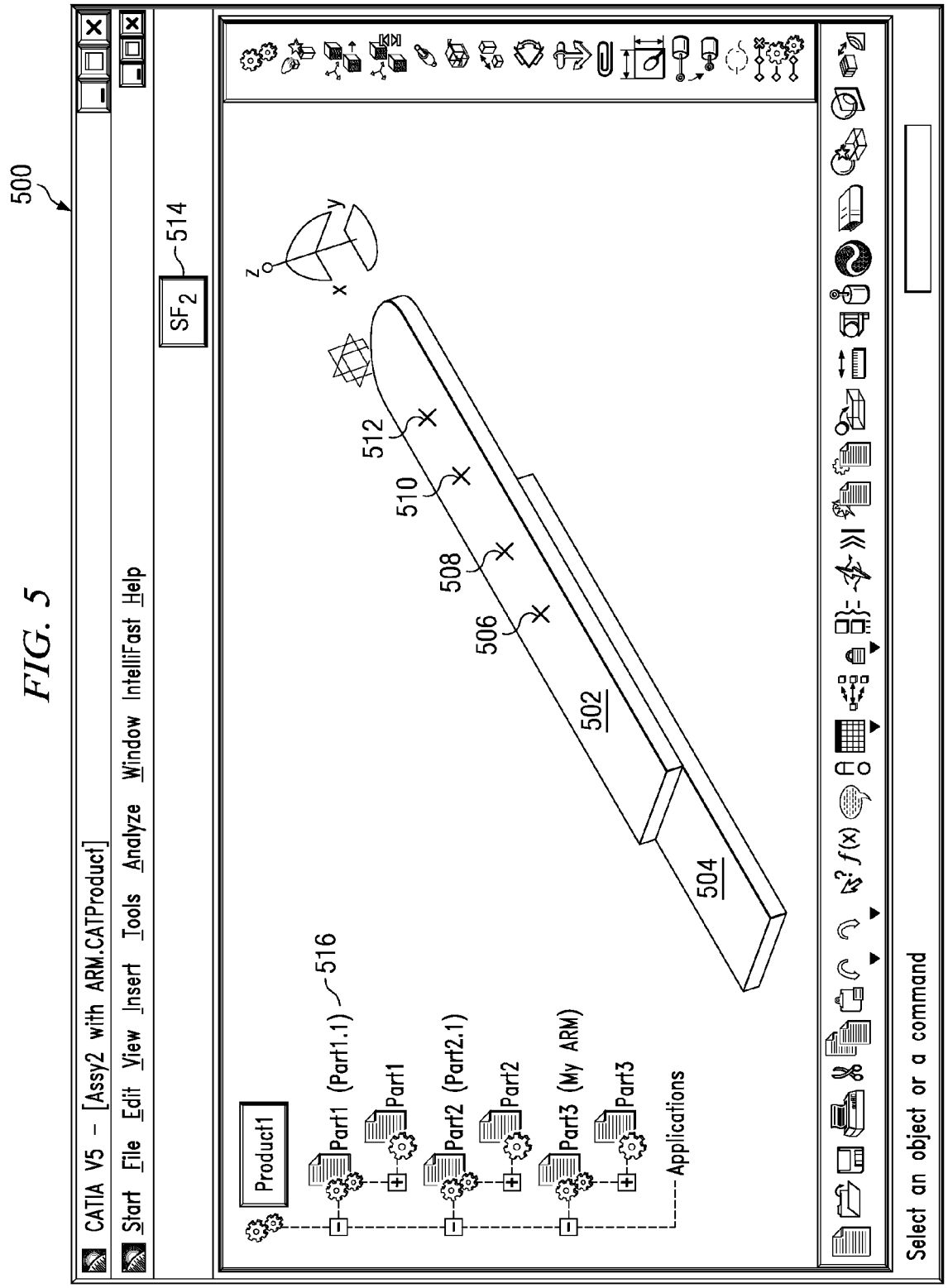
FIG. 5 is a user interface for creating and editing product definitions in accordance with an advantageous embodiment of the present invention.

Turning now to FIG. 5, a user interface for creating and editing product definitions is depicted in accordance with an advantageous embodiment of the present invention. In this example, interface 500 may be implemented in user interface 308 in FIG. 3. In this example, component 502 and component 504 are parts to be fastened. As depicted, points or locations 506, 508, 510, and 512 have been selected as points for fastener locations. Control 514 is a fastener placement tool icon, which may be used to initiate the fastener placement processes in the advantageous embodiments of the present invention. Tree 516 is a product definition tree structure identifying parts that are present in the product definition that is currently being worked on by a user.

Figure 6:
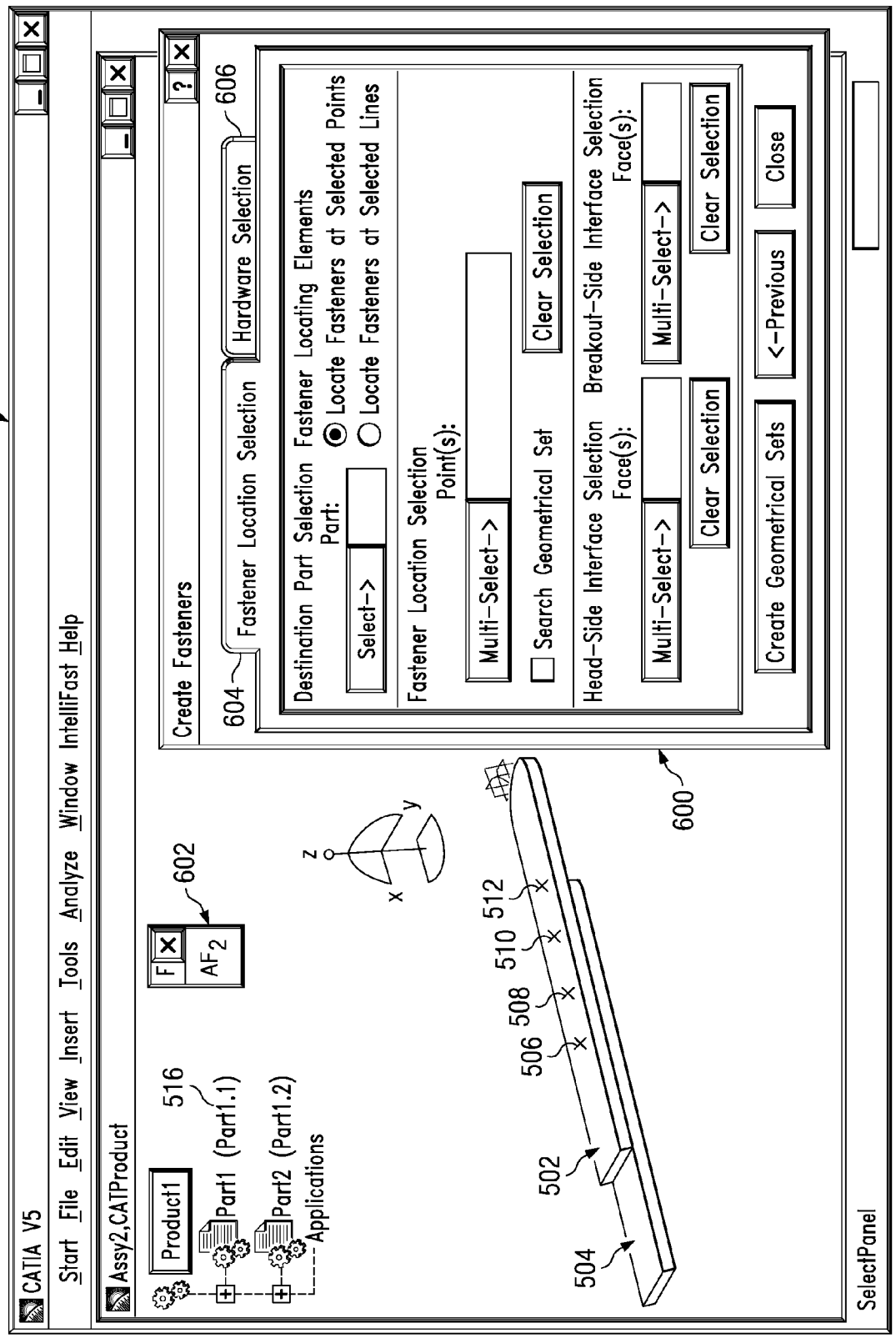
FIG. 6 is a diagram illustrating a fastener placement dialog in accordance with an advantageous embodiment of the present invention.

Turning now to FIG. 6, a diagram illustrating a fastener placement dialog is depicted in accordance with an advantageous embodiment of the present invention. In this example, dialog 600 is presented in interface 500 in response to a selection of control 514 in FIG. 5. In addition, tool bar button 602 is displayed in response to a selection of control 514 in FIG. 5. In this example, dialog 600 contains tabs 604 and 606. Tab 604 is a fastener location selection tab and tab 606 is a hardware selection tab.

Figure 7:
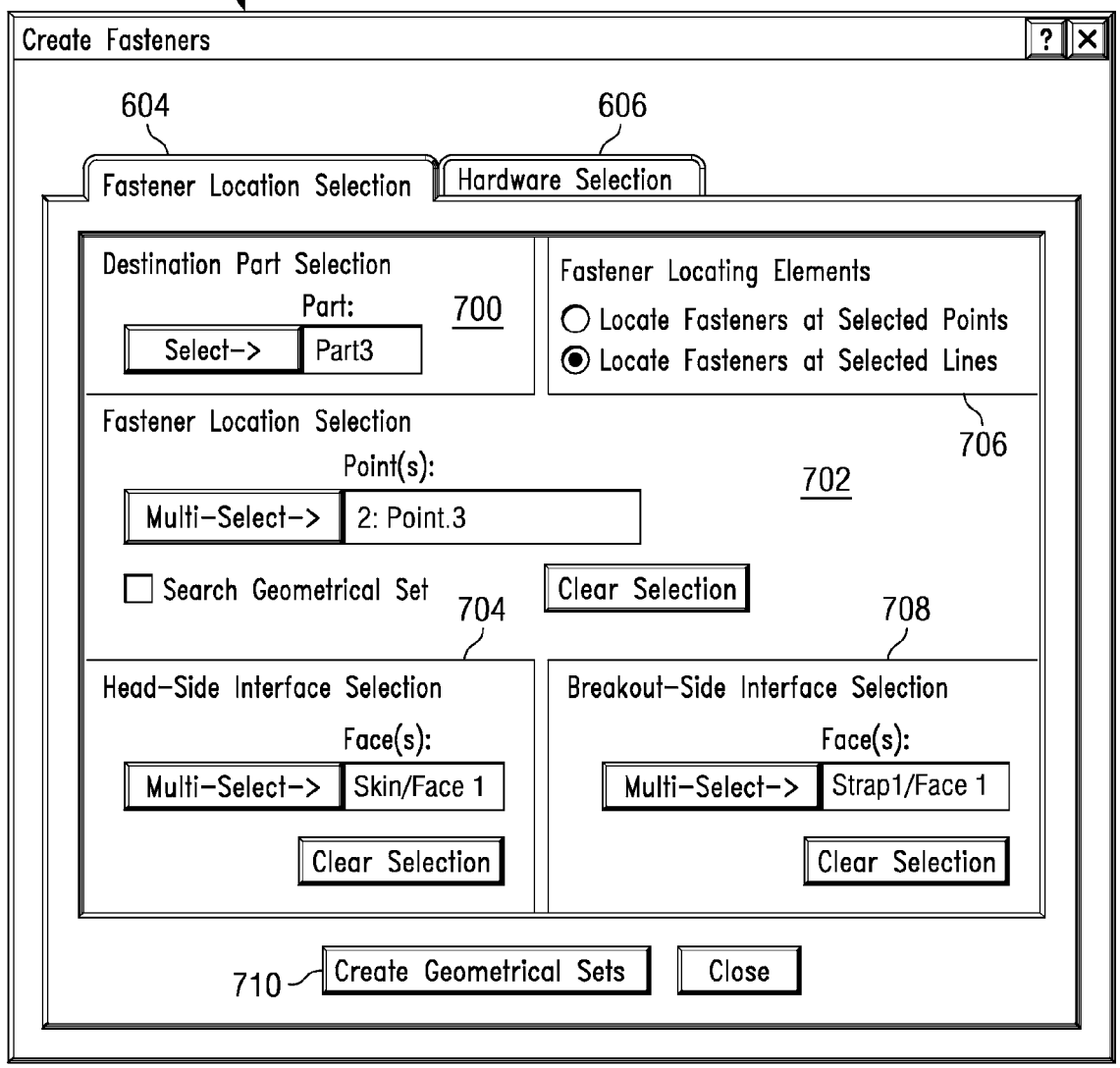
FIG. 7 is a diagram of a tab for selecting locations in a dialog for creating fasteners in accordance with an advantageous embodiment of the present invention.

With reference now to FIG. 7, a diagram of a tab for selecting locations in a dialog for creating fasteners is depicted in accordance with an advantageous embodiment of the present invention. In this example, field 700 on tab 604 allows a user to select or enter a collector file. Section 702 provides the user an ability to select points for fastener locations. Section 704 allows a user to select one or more faces associated with the fastener points. Next on tab 604, section 706 provides options that a user may select for defining a location for fasteners. In this example, the location may be to place fasteners at points or lines depending on how the user has defined where a fastener should be located. Section 708 on tab 604 provides a user an ability to select a face for the breakout. When the user has completed the different selections needed to create fasteners, the user may select or push button 710 to initiate processes to create fastener locations for each of the points as identified within tab 604.

Figure 8:
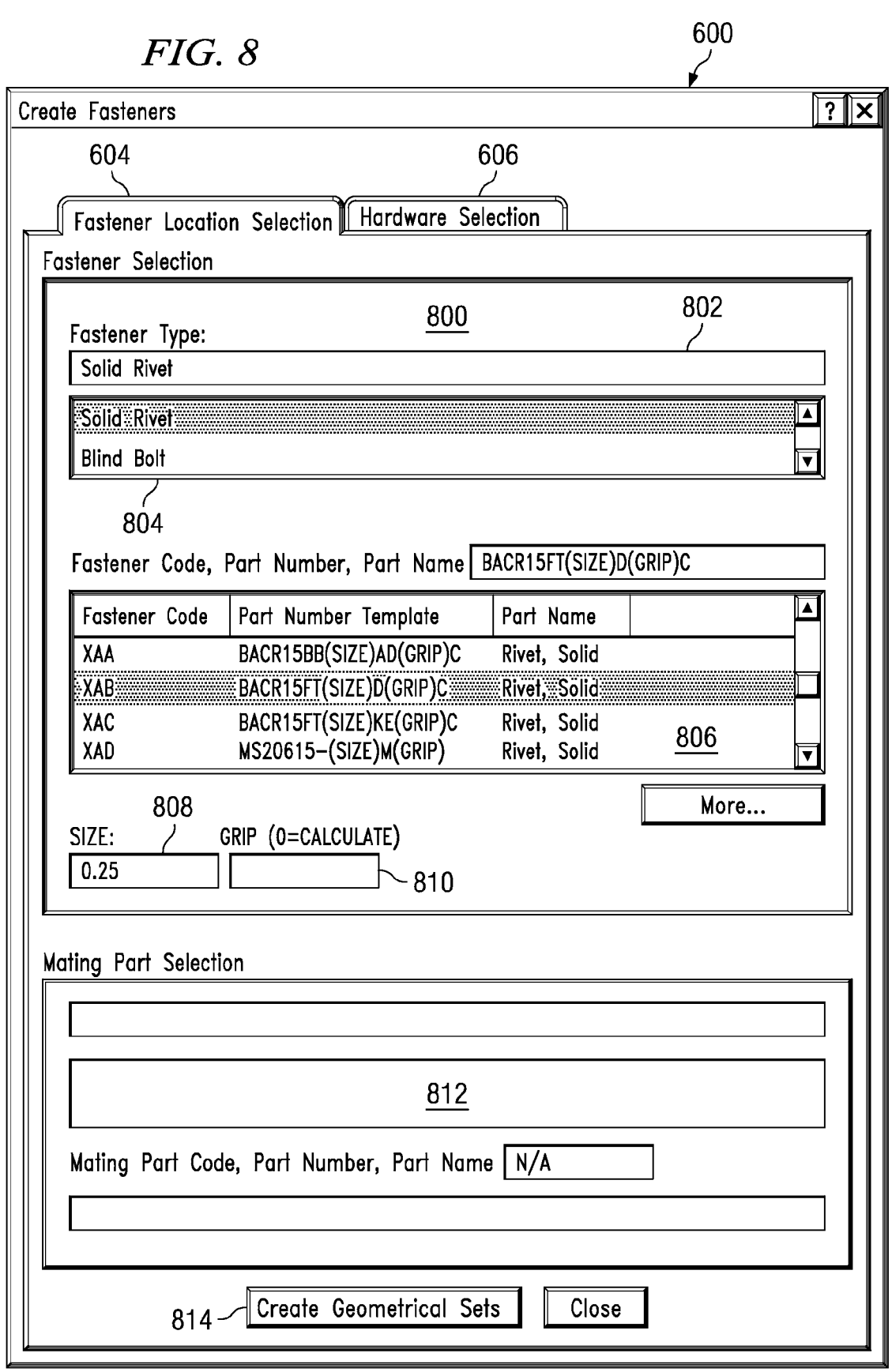
FIG. 8 is a more detailed diagram of a tab for hardware selection in a dialog for creating fasteners in accordance with an advantageous embodiment of the present invention.

Turning now to FIG. 8, a more detailed diagram of a tab for hardware selection in a dialog for creating fasteners is depicted in accordance with an advantageous embodiment of the present invention. In this example, tab 606 allows a user to input hardware selections or information for the fasteners. Section 800 allows a user to select a type of fastener. This fastener may be selected from a list of different fastener types. A selected fastener type is found in field 802, which is selected from scrollable list 804. When a particular type of fastener is selected in field 802, scrollable list 806 provides a list of fasteners for that type. The nominal diameter for a selected fastener is found in field 808.

In these examples, field 810 provides for a grip, which is automatically calculated using the different processes in the advantageous embodiments of the present invention. Section 812 allows for a user to select mating parts for the fastener depending on the type of fastener. For example, a rivet does not have mating parts. After the selections have been made, a user may select or push button 814 to initiate processes to create the fastener sets for the fastener locations.

Figure 9:
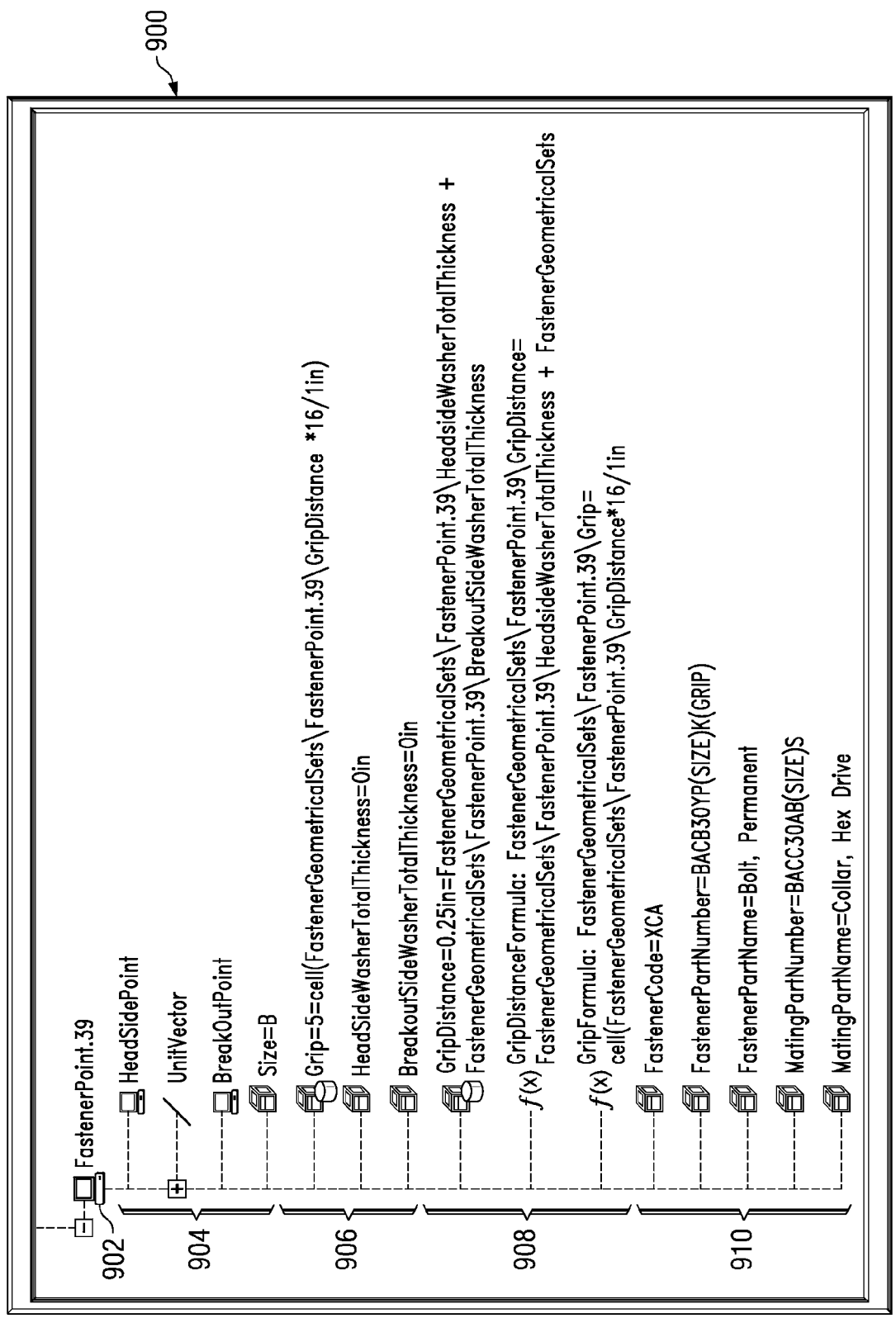
FIG. 9 is a diagram illustrating one manner in which information may be stored for fastener location in accordance with an advantageous embodiment of the present invention.

Turning now to FIG. 9, a diagram illustrating one manner in which information may be stored for a fastener location is depicted in accordance with an advantageous embodiment of the present invention. In this example, the information for a fastener location is stored in tree 900. Node 902 provides an identifier for the fastener location. The nodes in section 904 provide points and a direction vector. The nodes in section 906 provide for the size and grip parameters for the particular fastener locations. The nodes in section 908 provide formulas for grip calculation. The nodes in section 910 provide hardware part family information.

Additional information may be stored in tree 900 depending on the particular implementation. For example, indicators for wet install, cold work requirement, counter sink, and counter bore may be included. Other information includes, for example, hole ID number, diameter and tolerance.

Figure 10:
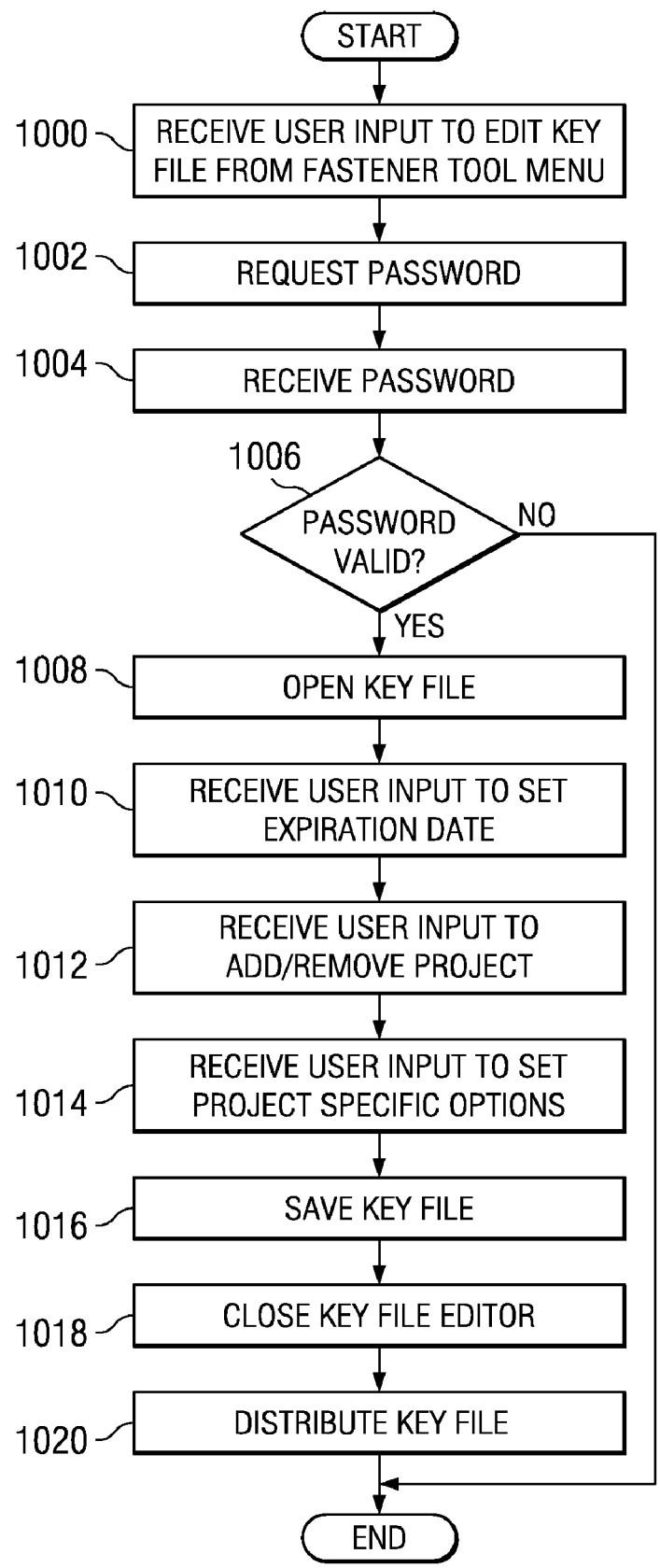
FIG. 10 is a flowchart of a process for managing project options for a fastener placement tool in accordance with an advantageous embodiment of the present invention.

With reference next to FIG. 10, a flowchart of a process for managing project options for a fastener placement tool is depicted in accordance with an advantageous embodiment of the present invention. The process illustrated in FIG. 10 may be implemented in a fastener placement tool, such as fastener placement tool 302 in FIG. 3. This process is used to manage different project options that may be accessed by a user of the fastener placement tool.

The process begins by receiving user input to edit a key file from the fastener tool menu (operation 1000). A key file is a file that stores a list of projects and associated project fastener tool options. The key file is used to determine what options may be used. Thereafter, a password is requested (operation 1002) and user input entering the password is received (operation 1004). Next, a determination is made as to whether the entered password is valid (operation 1006). If the password entered is not valid, the process terminates. If the entered password is valid, then a key file is opened (operation 1008). This key file may be a new or existing key file depending on the user input received in operation 1000.

Thereafter, user input is received to set an expiration date for the key file (operation 1010). The expiration date set in operation 1010 allows for more control by project management to ensure that users are employing current processes. This expiration date is used in these examples because projects are often isolated and the possibility of network outages may make it unreasonable to access key file information through a single source. Expiration of an older key file forces the use of more recent key files, which may include updated information. For example, accessing part information from a user designed spreadsheet may be acceptable near the beginning of a new project. After an official approved standards list is created, using this type of spreadsheet is no longer accepted for the project. The expiration date of the key file may be made to coincide with the change in access for part information.

Next, user input is received to add and/or remove projects (operation 1012). A project may be added or removed for different reasons. For example, the production of a new commercial aircraft may be designated with a number for the project, such as, for example, "787". Further, different project designations may be made for different teams working on the same aircraft. Further, project designations may be made for particular components, assemblies, or sub-assemblies of an aircraft. Additionally, a project may encompass an entire family of aircraft. With different teams for the same aircraft, one team may use a different preferred list of fasteners than another team. For example, a team working on a cargo bay may use different fasteners than another team working on the wing of an aircraft.

Then, user input is received to set project specific options (operation 1014). These options include, for example, sources for approved fasteners, collector data type for fastener data storage, document type, and associativity options. After these options have been set, the process saves the key file (operation 1016). The key file editor then closes (operation 1018).

Thereafter, the process distributes the key file (operation 1020) with the process terminating thereafter. In distributing the key file, the distribution may be locally in the data processing system on which the fastener placement tool is located. Alternatively, the key file may be stored in a location that is accessible by other workstations. For example, the key file may be stored in policy 330 in FIG. 3.

Figure 11:
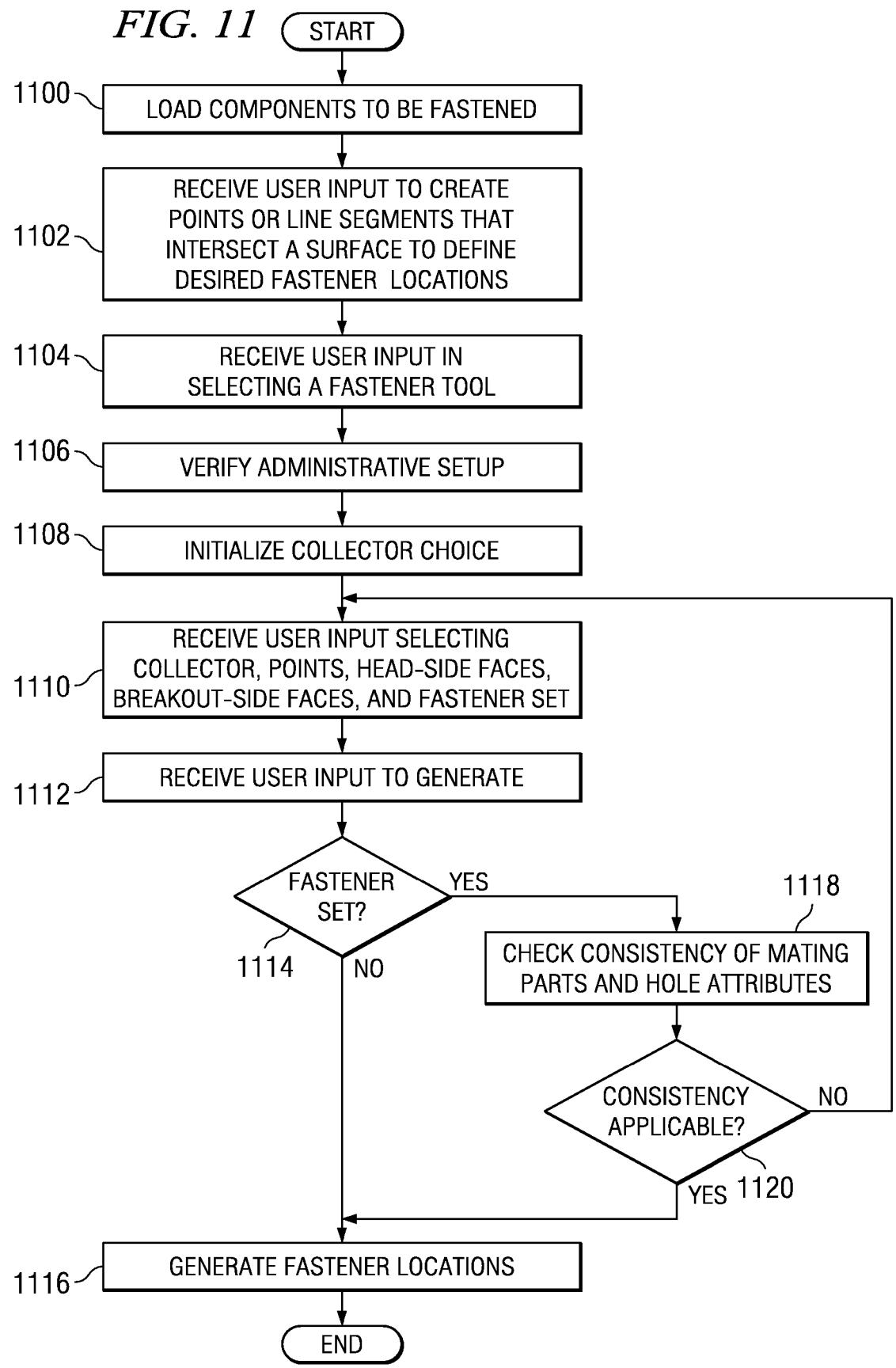
FIG. 11 is a flowchart of a process for selecting locations for fasteners in accordance with an advantageous embodiment of the present invention.

Turning next to FIG. 11, a flowchart of a process for selecting locations for fasteners is depicted in accordance with an advantageous embodiment of the present invention. The process illustrated in FIG. 11 may be implemented in a fastener placement tool, such as fastener placement tool 302 in FIG. 3.

The process begins by loading components to be fastened (operation 1100). In these examples, the components may be from a library of components or ones located in a currently loaded product definition. Thereafter, user input is received to create points or line segments that intersect a surface to define fastener locations (operation 1102). The user input in operation 1102 may be made through a user interface, such as user interface 308 in fastener placement tool 302 in FIG. 3.

Prior to placing fasteners in a product definition, a user creates a point on a component to provide a location where a fastener is desired. This surface is also referred to as the "face". Alternatively, a line segment may be created that intersects a face of a part at the location where the fastener is to be located. In these examples, these points are assumed to be on the side of the component where the head of the fastener is located. Of course the orientation direction of the fastener may be changed depending on the particular implementation. These points are also referred to as fastener points or pierce points.

The process then receives user input selecting the fastener tool (operation 1104). The fastener tool may be selected through a menu item or an icon in these examples. Selection of this option initiates the process used to place fasteners in the locations designated by the user in operation 1102. Thereafter, the process verifies the administrative setup (operation 1106). A more detailed description of operation 1106 is found in the description of FIG. 12 below.

Operation 1106 is performed to ensure that information has been selected and that the information is correct for use in placing the fasteners. Thereafter, the process initializes the collector choice (operation 1108). The collector data type will have been specified during the administrative setup in operation 1014 illustrated in FIG. 10. The collector choice in operation 1108 is initialized from the last used collector saved in session data manager 307 of FIG. 3 or the first valid collector of the appropriate collector data type that is found in the currently loaded product definition.

A collector is a top level part or file that contains fastener information. In the Dassault Systemes computer-aided design (CAD) modeling environment, which consists of the CATIA® V5R17 three dimensional modeler and the ENOVIA LCA product data model, a collector can be an ENOVIA product, CATIA® CATPart, or CATIA® CATProduct. Two types of collectors are currently defined in the illustrative embodiments. One type of collector is an engineering requirements model (ERM), which is a CATPart file set up as an annotation set to capture functional tolerancing and annotation (FT&A) data. The engineering requirements model is recognized as a special file type by ENOVIA. This model can contain other functional tolerancing and annotation data in addition to the fastener data.

Another type of collector is a fastener location model (FLM), which is a CATPart exclusively for storing fastener data. This type of collector segregates the fastener data from other types of engineering data. These collectors illustrate one advantageous embodiment of the present invention and other collectors with similar properties may be used for other modeling environments.

Thereafter, the process receives information, such as the collector, points, head-side faces, breakout-side faces, and fastener set (operation 1110). The selection of the collector is optional in these examples. In these examples, a face is a surface of a component. A breakout face may be explicitly specified by a user or searched for by extending a line in the normal direction finding out what faces are intersected by the line. Thereafter, the process receives user input to generate the fasteners (operation 1112).

A determination is made as to whether a fastener set is present (operation 1114). A fastener set is a grouping of fastener hardware, mating hardware, and spacer hardware that is associated with a single location. For example, a bolt, nut, and washer can be grouped together to define a fastener set.

Operation 1114 takes into account that the process used in the fastener tool may be able to support the performing of parts of the process even if insufficient information is currently present to complete placing the fastener. For example, if a user is still waiting for information, such as strength analysis, to determine what fastener hardware is needed, fastener locations can still be specified. In this example, a fastener family would not be set but locations may still be generated without all of the hardware data. Once the fastener details are known, this information may then be added to the particular location generated.

If a fastener set is not present, fastener locations are generated (operation 1116) with the process terminating thereafter. With reference again to operation 1114, if a fastener set is present, the consistency of mating parts and hole attributes are checked (operation 1118). The consistency check performed in operation 1118 is employed to determine whether a fastener set is consistent.

Thereafter, a determination is made as to whether the consistency is acceptable (operation 1120). The decision in operation 1120 is made using the results from the check returned by operation 1118. A more detailed description of this operation is found in the description of FIGS. 15A and 15B below. If the consistency is acceptable, the operation proceeds to operation 1116 as described above. Otherwise, the process returns to operation 1110 to receive additional user input.

Figure 12:
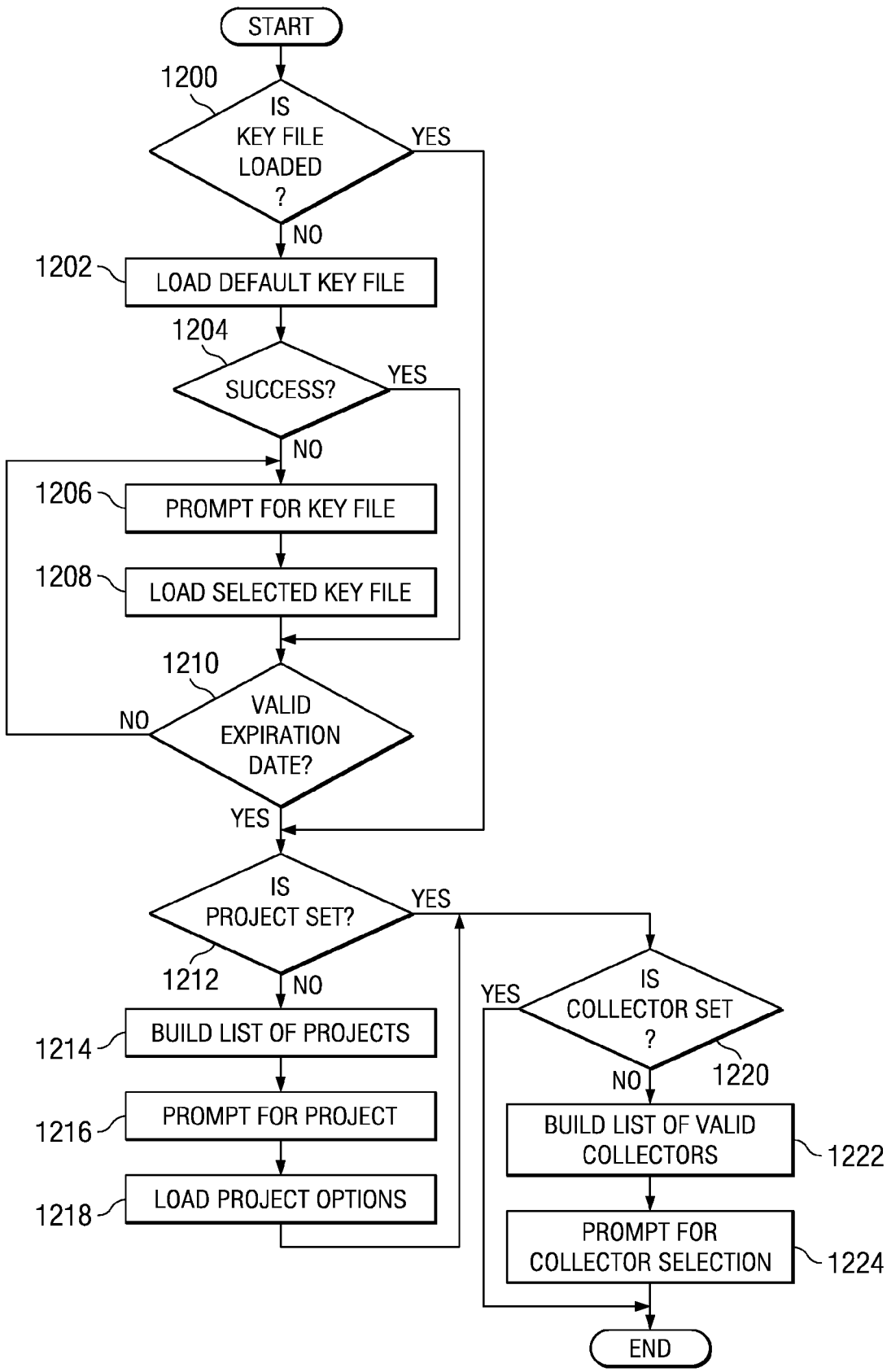
FIG. 12 is a flowchart of a process for verifying an administrative setup in accordance with an advantageous embodiment of the present invention.

With reference next to FIG. 12, a flowchart of a process for verifying an administrative setup is depicted in accordance with an advantageous embodiment of the present invention. The process illustrated in FIG. 12 is a more detailed explanation of operation 1106 in FIG. 11.

The process begins by determining whether a key file has been loaded (operation 1200). In these illustrative examples, the key file may be located at the computer or in a remote location, such as policy 330 in FIG. 3. If a key file is not already loaded for the fastener tool, a default key file is loaded (operation 1202).

Thereafter, a determination is made as to whether loading of the default key file was successful (operation 1204). If the loading of the key file was not successful, a prompt is made to the user to select a key file (operation 1206). Thereafter, the selected key file is loaded (operation 1208). In operation 1206, the user may be provided with a list of key files or enter a location of the key file.

Next, a determination is made as to whether the key file loaded has a valid expiration date (operation 1210). If the key file does not have a valid expiration date, the process returns to operation 1206 to prompt the user to select or enter another key file.

With reference again to operation 1204, the process also determines whether a valid expiration date is present, as described in operation 1210, if the default key file was successfully loaded. In operation 1210, if the expiration date is valid, a determination is made as to whether a project has been set (operation 1212). If a project has not been set, the process builds a list of projects (operation 1214). These projects are ones specified in the key file in these examples.

Thereafter, the process prompts for a project (operation 1216). Project options are then loaded (operation 1218). The process then determines whether a collector has been set (operation 1220). If a collector has not been set, the process builds a list of valid collectors (operation 1222). In operation 1222, the list is built in these examples by traversing a currently loaded product structure, such as tree 516 in FIG. 5.

The items of a product definition are typically stored in a tree structure with the root node of the tree representing the entire product definition. The children of the root node represent the top level assemblies and parts in the product definition and successive levels contain lower level sub-assemblies and design details. A search algorithm or process starts with the beginning of the product definition (root node) and examines its children and recursively the children's children until the entire product definition has been examined. All entities are examined to determine their type and all entities of the appropriate collector data type are added to the list of valid collectors. Thereafter, the process prompts the user to select a collector (operation 1224). Afterwards, the process for verifying an administrative setup terminates.

With reference again to operation 1220, if a collector is set, the process terminates. Turning back to operation 1212, if a project is set, the process proceeds directly to operation 1220. In operation 1200, if a key file is loaded, the process proceeds to operation 1212. In these examples, the key file, project, and collector also may be changed by a user through administrative functions.

Figure 13:
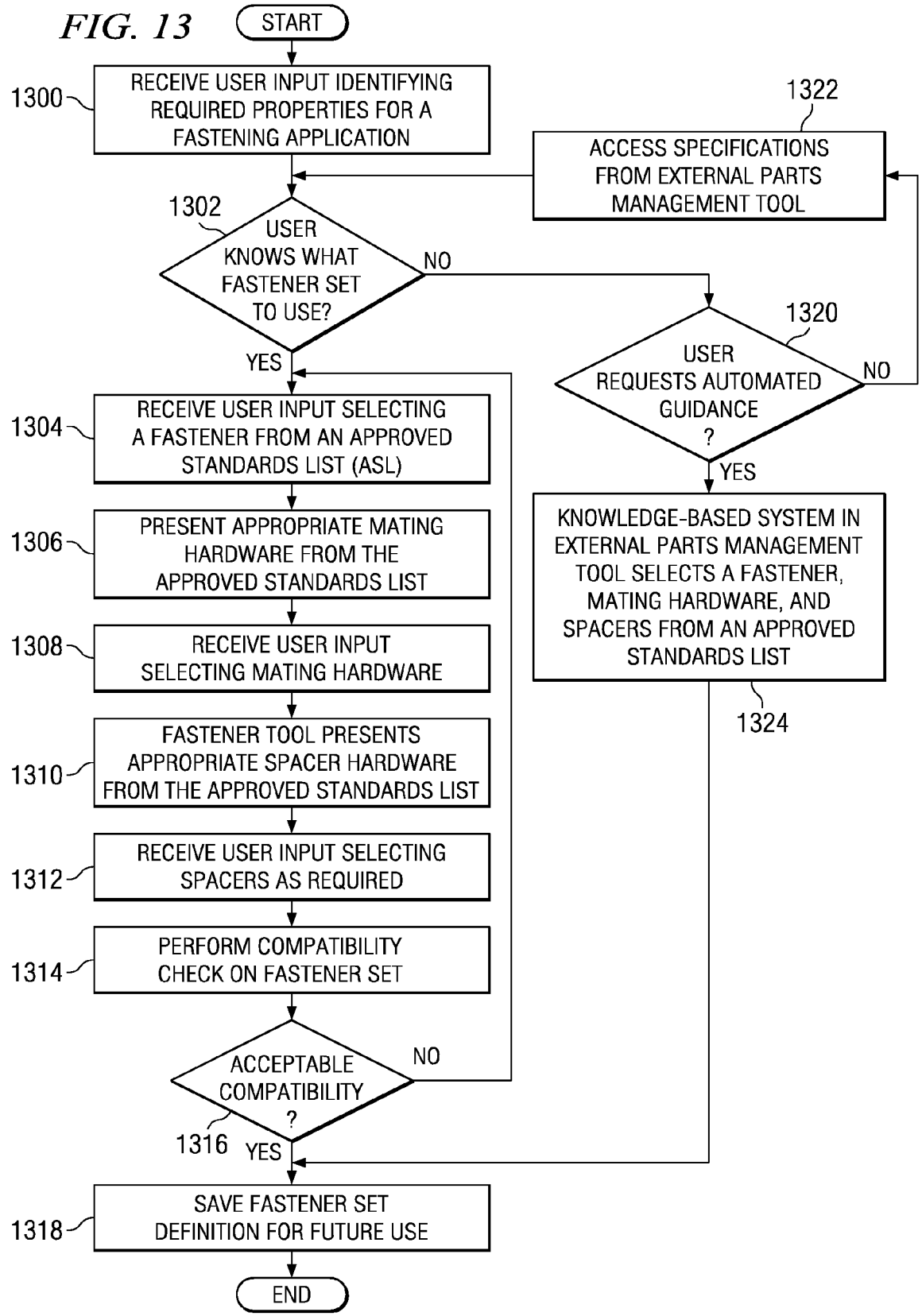
FIG. 13 is a flowchart of a process for specifying a fastener set in accordance with an advantageous embodiment of the present invention.

Turning now to FIG. 13, a flowchart of a process for specifying a fastener set is depicted in accordance with an advantageous embodiment of the present invention. The process illustrated in FIG. 13 may be implemented in a fastener placement tool, such as fastener placement tool 302 in FIG. 3. A fastener set is a grouping of items used to fasten components together. This grouping of items includes a fastener, mating hardware, and optionally, spacers. A fastener may be, for example, a bolt, a pin, or a screw. Mating hardware may be, for example, a nut or collar. Spacers may be a flat washer or a lock washer depending on the particular implementation.

The user first identifies required properties for a fastening application (operation 1300). These requirements come from outside sources such as structural or materials engineering. These requirements may include, for example, load rating, type of joint, material and finish considerations. For example, the type of joint may be a friction or tension joint depending on the particular implementation. Thereafter, a determination is made as to whether the user knows what fastener set to use (operation 1302). This determination may be based on the user identification in operation 1300. The user may select a fastener set or may select an option indicating that the user does not know which fastener set to use.

If the user knows which fastener set to use, the process receives user input selecting a fastener set from an approved standards list (operation 1304). In these examples, an approved standards list is a set of standard parts. These parts include, for example, fastening hardware, which has been approved for use on a specific project. Typically, individual projects will have different lists of approved parts. Thereafter, the process presents appropriate mating hardware from the approved standards list (operation 1306). The process receives user input selecting mating hardware (operation 1308). In response to receiving the selection of mating hardware, the process presents appropriate spacer hardware from the approved standards list (operation 1310).

Next, the process receives user input selecting spacers from the presented spacer hardware as required (operation 1312). The process then performs a compatibility check on the fastener set as selected by the user (operation 1314). A determination is made as to whether acceptable compatibility is present for the fastener set selected (operation 1316). If the compatibility is acceptable, the process saves the fastener set definition for future use (operation 1318) with the process terminating thereafter.

With reference again to operation 1316, if the fastener set is not acceptable with respect to compatibility, the process returns to operation 1304 to start the selection of the fastener set again. With reference again to operation 1302, if a user does not know which fastener set to use, a determination is made as to whether the user requests automated guidance (operation 1320). If the user does not request automated guidance, the process accesses specifications from an external parts management tool (operation 1322). The process then returns to operation 1302. Operation 1322 provides the user with information about fastener sets to allow the user to make a selection. With reference again to operation 1320, if the user requests automated guidance, the process uses a knowledge based system in an external parts management tool to select a fastener, mating hardware, and spacers from an approved standards list (operation 1324). The process then proceeds to operation 1318.

Figure 14A:
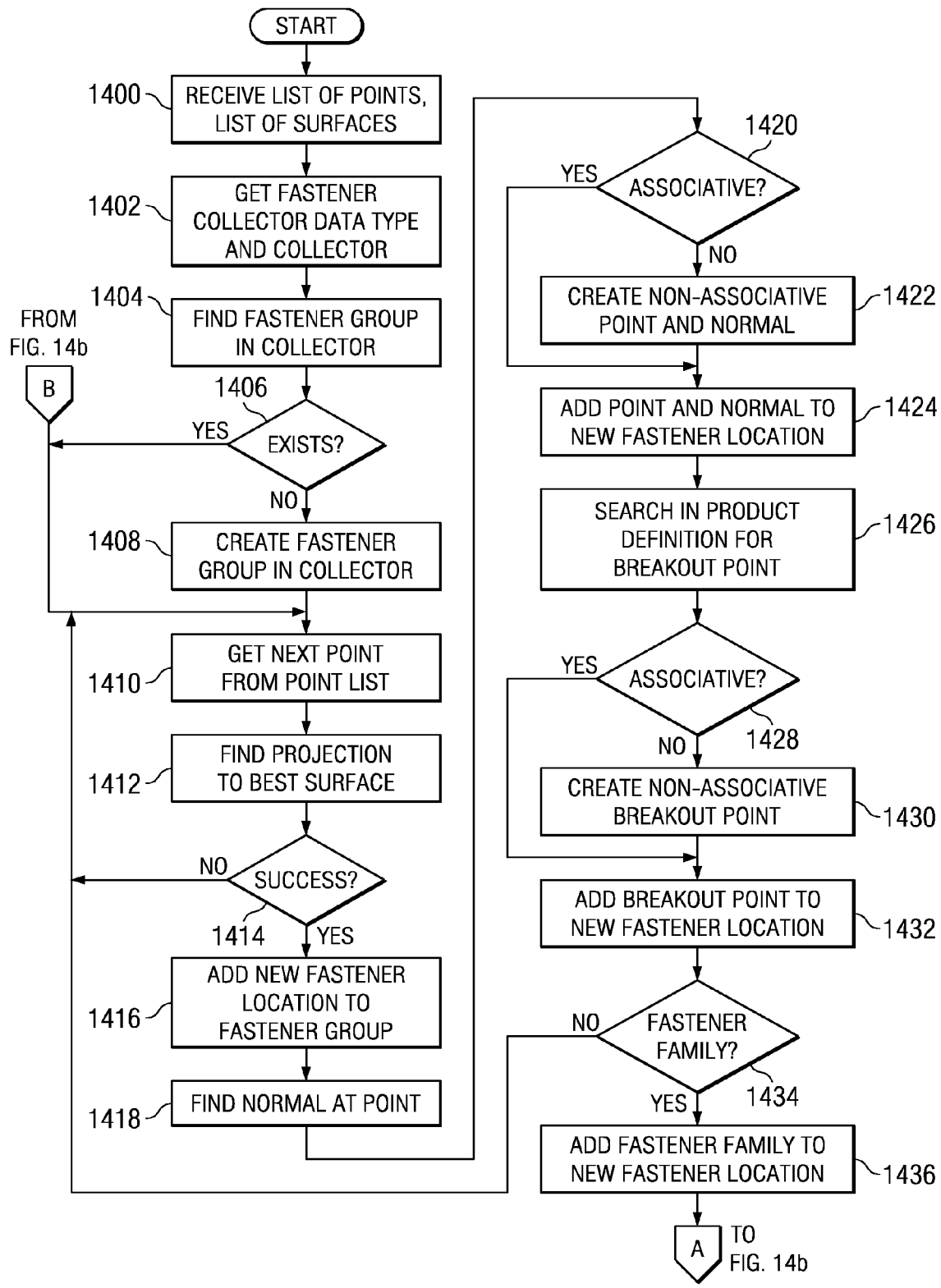
FIGS. 14A and 14B are flowcharts of a process to generate locations in accordance with an advantageous embodiment of the present invention.
Figure 14B:
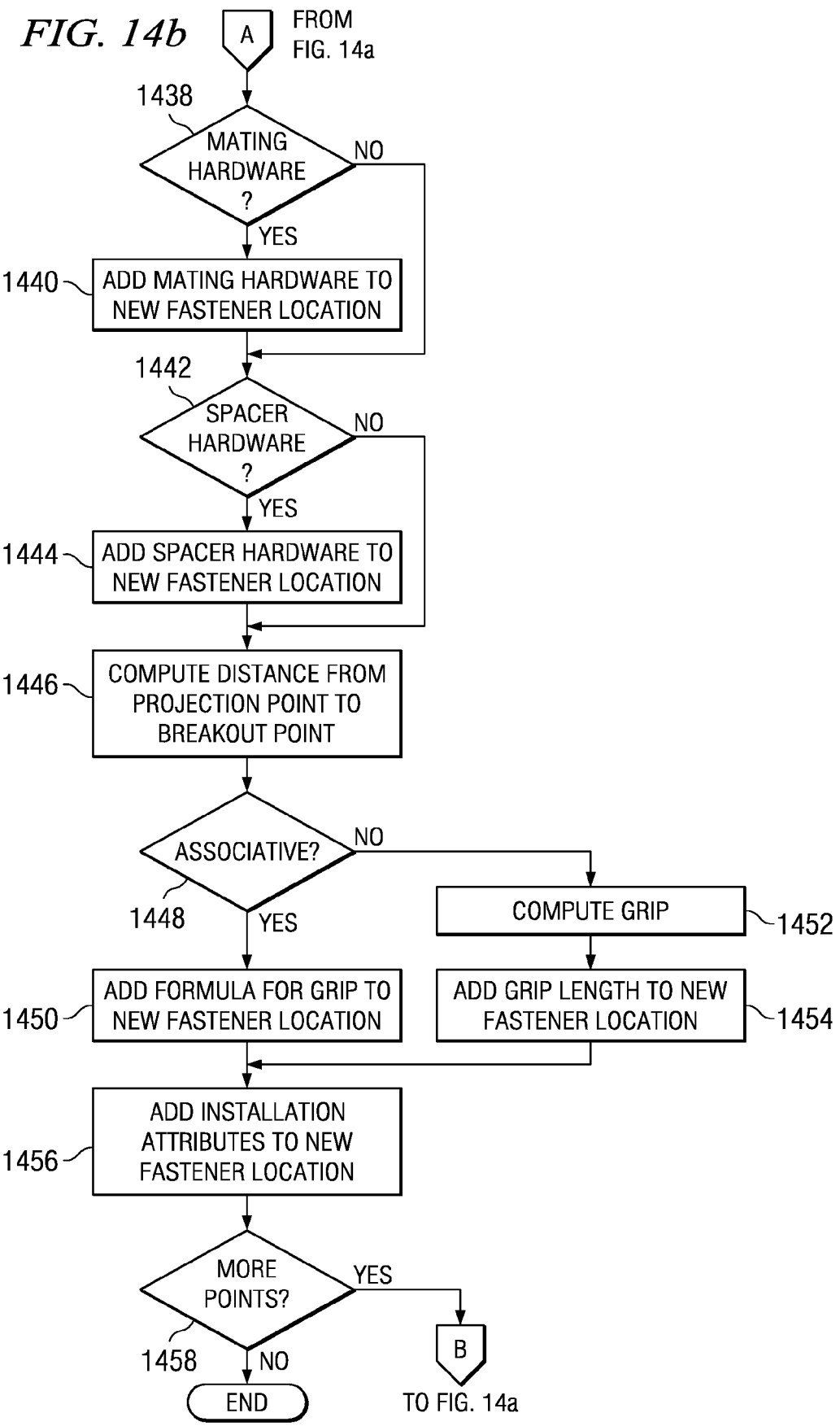

Turning now to FIGS. 14A and 14B, flowcharts of a process to generate locations is depicted in accordance with an advantageous embodiment of the present invention. The location of a fastener is generated by a process in a software component, such as fastener placement tool 302 in FIG. 3.

In particular, the process in FIGS. 14A and 14B generates fastener locations. A fastener location is a data structure, which defines the location and attributes of an instance of a fastener set. These attributes, may include, for example, part numbers. These fastener locations are found within a fastener group for a collector in these particular examples. A fastener group is a top level group data structure within a collector that is a container for each fastener location. Collectors, fastener groups, and fastener locations are types of data structures that are found in currently used computer aided design systems, such as CATIA® V5R17. In these examples, the placement of a fastener is normal to the surface of the component. Normal is a term for a unit normal defined at a given point on a surface and perpendicular to the surface at the point.

The process in FIGS. 14A and 14B begins by receiving a list of points and a list of surfaces (operation 1400). In these examples, the points are pierce points. A pierce point is the point on a surface of a component where the fastener is to be located. In these examples, the head side of the fastener is located on this surface. Thereafter, the fastener collector data type and the collector are obtained (operation 1402). This information may be obtained from a data manager, such as session data manager 307 in FIG. 3. The fastener collector data type refers to the type of collector in which the fastener information will be stored. The key file provides project options including an identification of the collector data type, which is subsequently stored in the data manager.

Thereafter, the process searches for a fastener group in the collector (operation 1404). In these depicted examples, a fastener group is the top level data structure in the collector that is a container for each fastener data location. In these illustrative examples, in the engineering requirements model definition for CATIA V5R17, this is a CATIA® Geometrical Set entity named "FastenerGeometricalSets".

A determination is made as to whether the fastener group exists in the collector (operation 1406). If the fastener group does not exist, a fastener group is created in the collector (operation 1408). Thereafter, the process obtains the next point that has not been processed from a point list (operation 1410). The process also proceeds to operation 1410 from operation 1406 if a fastener group is present in the collector.

The process then finds a projection to the best surface (operation 1412). When multiple points and/or surfaces are identified by the user, each point is projected onto each surface with the projection direction normal to the surface. The resulting projection point that is closest to the original point is used and the associated surface is considered the best surface for the point projection.

A user may pick multiple points and/or multiple faces with the process identifying the appropriate face for projecting each point. A projection of a point to a face may fail if one or more points are present for which no acceptable face is found onto which to project a point. Further, limits may be present on the distance between the point and a face onto which a point projects. If a point is too far away from the face, the projection will fail. A determination is made as to whether operation 1412 was successful in finding a projection to the best surface (operation 1414). Success occurs in operation 1414 when a valid projection is found for each of the points.

If a projection to best surface cannot be found in operation 1412, the process returns to step 1410 to obtain the next unprocessed point from the point list. Otherwise, the process adds the new fastener location to the fastener group (operation 1416). The process then finds a normal at the point being processed (operation 1418).

A determination is made as to whether the normal at the point is associative (operation 1420). This determination is made using a data manager, such as session data manager 307 in FIG. 3. A point is associative if it is related to or associated with other geometric entities such that when a related geometry item changes, the associative entity is accordingly updated.

In these illustrative examples, a part is associative if the definition for the part retains a link to parameters or information for some other part. For example, the axis for a fastener is defined when a user selects a point in a face for a part. This axis is the line through the point and normal to the face. If the fastener is associative, when the point or face later changes in the design process, the fastener moves to the new location because the definition of the fastener remains dependent on the location of the point and the face. If the fastener is not associative, the fasteners location does not change when the point or face changes. In these examples, the fasteners may always be associative or created without associative links in which case the fasteners are never associative. Alternatively, individual cases may be selected based on user input to determine whether a particular link should be kept.

If the point and normal are not associative, a non-associative point and normal are created (operation 1422). Thereafter, the process adds the point and normal to the new fastener location (operation 1424).

The process proceeds to operation 1424 from the decision in operation 1420 if the point and normal are to be associative. Next, the product definition is searched for a breakout point (operation 1426). A breakout point is a given point on a surface representing one side of some parts to be fastened, and a direction (typically normal to the surface).

In other words, a breakout point is the point where a vector from the point in the given direction would come out on the other side of the group of parts to be fastened. For example, with the head of a fastener at the given point, the thread end of the bolt would come through the part at the breakout point. The breakout point is also used to position the mating hardware and breakout side spacers/washers with respect to the fastener hardware.

Also, small gaps may be present between the parts being fastened that are a planned aspect of the design. Determination of the breakout point accounts for such gaps by searching for all parts in the vector direction and using tolerances to determine when the other side of the set of parts being fastened has been reached.

A determination is made as to whether the breakout point is associative (operation 1428). This determination is made using data from a data manager, such as session data manager 307 in FIG. 3 by operation 1428 in these examples. If the breakout point is not associative, the process creates a non-associative breakout point (operation 1430). The breakout point is then added to the new fastener location (operation 1432). The process proceeds directly to operation 1432 from operation 1428 if the breakout point found in operation 1426 is associative.

Next, a determination is made as to whether a fastener family is present (operation 1434). A standard fastener is specified by a unique part number. Portions of the part number may indicate properties such as length, diameter, material, and finish. Replacing the size and or length indicators with a wildcard specification produces a set of parts, referred to as a part family, with different lengths and/or diameters. In the depicted examples, a unique part can be recovered by substituting for the wildcards with the actual length and size indication.

If a fastener family is not present, the process returns to operation 1410 to obtain another point from the point list for processing. If a fastener family is present, the fastener family is added to the new fastener location (operation 1436). Thereafter, a determination is made as to whether mating hardware is present for the fastener (operation 1438). If mating hardware is present, the mating hardware is added to the new fastener location (operation 1440).

Thereafter, a determination is made as to whether spacer hardware is present (operation 1442). The process also proceeds to operation 1442 directly from operation 1438 if mating hardware is absent. If spacer hardware is present, the process adds the spacer hardware to the new fastener location (operation 1444). The distance between the projection point and the breakout point is computed (operation 1446). The process proceeds directly to operation 1446 from operation 1442 if spacer hardware is not present for the fastener.

A determination is made as to whether the distance from the projection point to the breakout point is associative (operation 1448). If the distance from the projection point to the breakout point is associative, a formula is added for grip to the new fastener location (operation 1450). If the distance is not associative in operation 1448, the grip is computed (operation 1452). The grip length is added to the new fastener location (operation 1454). The grip length is the combination of the thickness of the material being fastened plus any washers or other spacers, and determines the length of fastener required. The grip is an encoding of this length that replaces the grip wildcard in the fastener family definition.

Both operation 1450 and operation 1454 results in adding installation attributes to the new fastener location (operation 1456). These attributes are entered through a user interface by a user in these particular examples. Then, a determination is made as to whether additional points are present for processing on the list (operation 1458). If additional points are present, the process returns to operation 1410, otherwise, the process terminates.

Figure 15A:
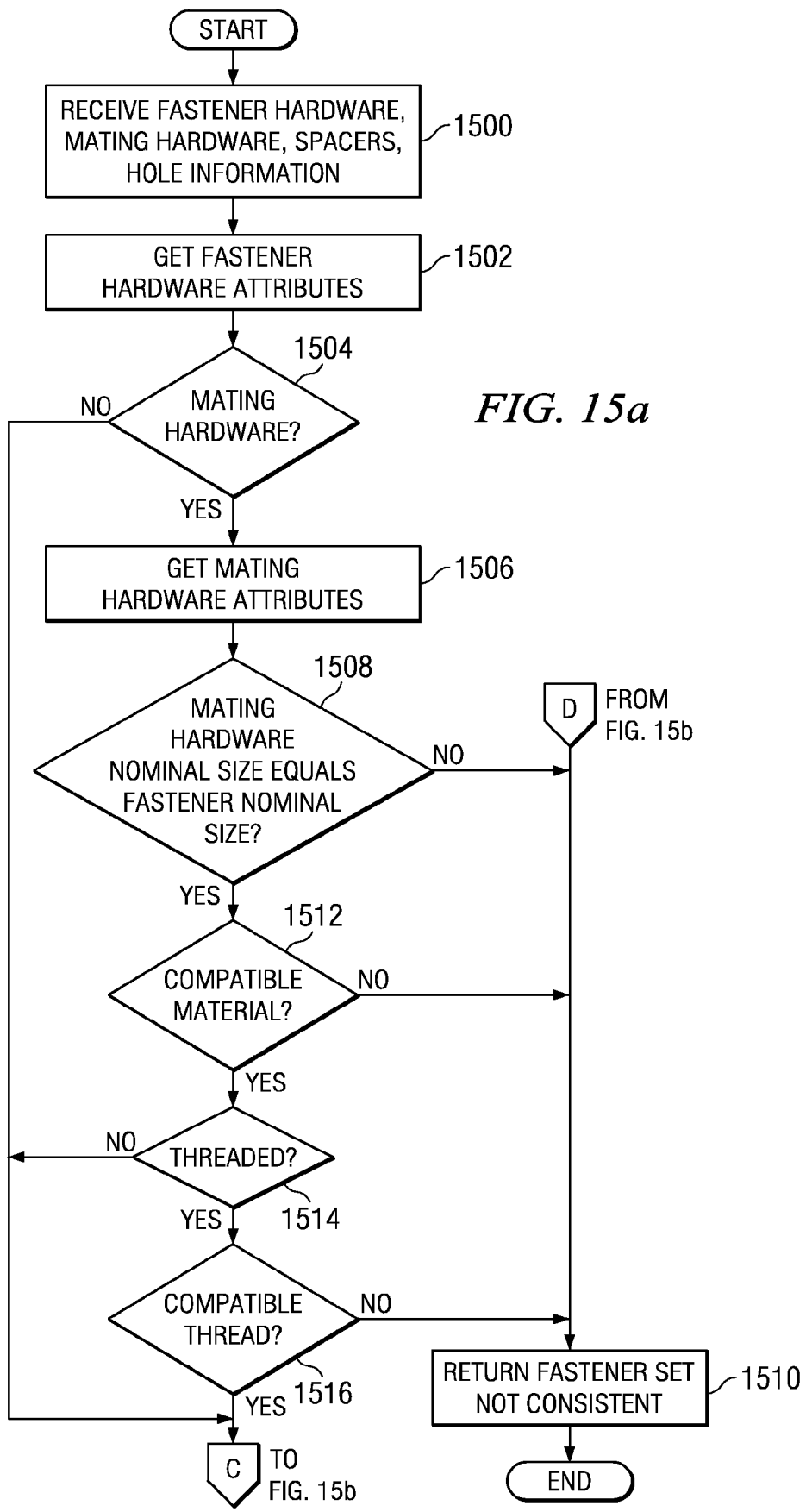
FIGS. 15A and 15B are flowcharts of a process for a consistency check in accordance with an advantageous embodiment of the present invention.
Figure 15B:
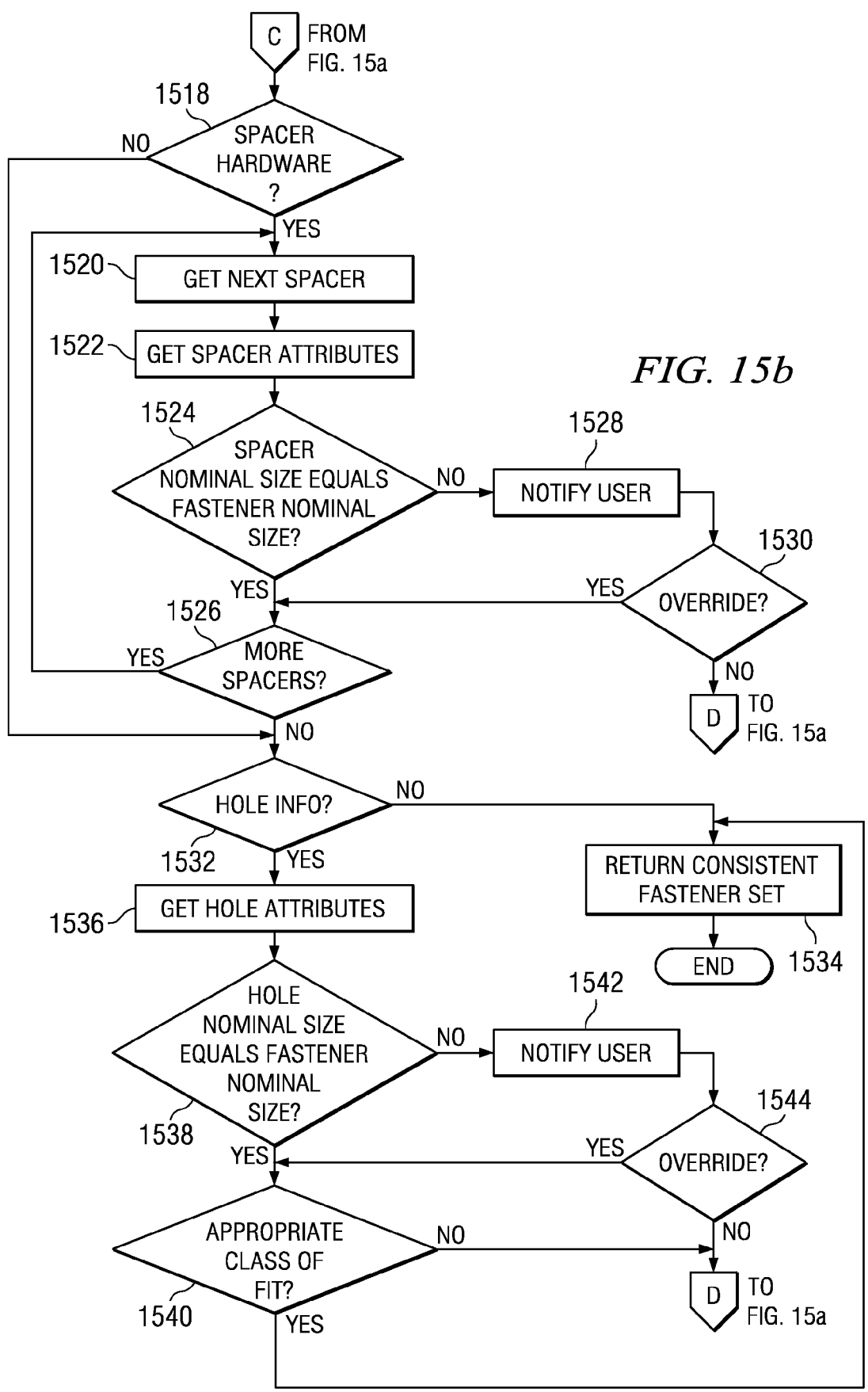

Turning now to FIGS. 15A and 15B, flowcharts of a process for a consistency check is depicted in accordance with an advantageous embodiment of the present invention. The process illustrated in FIGS. 15A and 15B is a more detailed description of operation 1118 in FIG. 11. This type of testing checks for common compatibility errors and if none of these errors occur, the parts are considered compatible.

The process begins by receiving fastener hardware, mating hardware, spacers, and hole information (operation 1500). The process then obtains fastener hardware attributes (operation 1502). The attributes are obtained from an external standard parts management tool, such as specifications 320 or fastener hardware information 322 in external parts management tool 304 illustrated in FIG. 3. Thereafter, a determination is made as to whether mating hardware is used for the fastener (operation 1504). This determination may be made based on the attributes obtained in operation 1502. If mating hardware is used with the fastener, mating hardware attributes are then obtained (operation 1506).

Then, a determination is made as to whether the mating hardware nominal size equals the fasteners nominal size (operation 1508). If the mating hardware nominal size is not equal to fastener nominal size, the process returns an indication that the fastener set is not consistent (operation 1510) with this process terminating thereafter. If the sizes are equal, a determination is made as to whether the fastener hardware and the mating hardware have compatible materials (operation 1512). In these examples, rather than maintaining a parts list of what parts are compatible, operation 1512 is used to perform compatibility testing.

In performing operation 1512, information from operation 1502, such as the nominal size (diameter) whether threads are applicable, hole size, material used for fastener and mating parts, and class fit are used. The first three items are managed by obtaining nominal diameters for the parts and thread specification and determining whether these diameters are the same. Determining the material compatibility and class of fit suitability involves tests that may include sending a query to an external parts management tool to determine whether the material and class of fit are appropriate. The final consistency determination is based on the response from the external parts management tool.

Of course, other types of consistency assessments may be implemented depending on the particular embodiment. For example, additional information, such as the type of material being fastened, the thickness of the material, and the required strength of the fastener may be sent along with the fastener selection. This information may be used to determine whether the selected fastener is suitable for use and provide an alternate recommendation if the selected fastener is not suitable for use. If the materials between the fastener and the mating hardware are not compatible, the process proceeds to operation 1510 as described above.

Otherwise, a determination is made as to whether the fastener is threaded (operation 1514). If the fastener is threaded, a determination is made as to whether the mating hardware is compatible with the thread for the fastener (operation 1516). If the threading is not compatible, the process proceeds to operation 1510. If the thread for the fastener is compatible with the mating hardware, a determination is made as to whether a spacer is needed (operation 1518).

The process also proceeds to operation 1518 from operation 1514 if the fastener is not threaded. Operation 1518 also is performed if mating hardware is not needed in operation 1504. If spacer hardware is designated for the fastener, then a spacer is selected from the attribute information defined for the hardware that has not yet been processed (operation 1520). Spacer attributes are obtained for the selected spacer (operation 1522). A determination is made as to whether the spacer nominal size is equal to the fastener nominal size (operation 1524).

If the spacer nominal size is equal to the fastener nominal size, a determination is made as to whether more spacers are present that have not yet been processed (operation 1526) If more spacers are present, the process returns to operation 1520 to select another spacer.

With reference again to operation 1524, if the spacer nominal size is not equal to the fastener nominal size, a notification is generated for the user (operation 1528). A determination is made as to whether the user has selected to override and use the spacer (operation 1530). If the user decides to override the notification of the mismatch in sizes, the process returns to operation 1526. Otherwise, the process proceeds to operation 1510 as described above.

In operation 1526, if more spacers are not present, a determination is made as to whether hole information is present for the fastener (operation 1532). If hole information is not present, the process proceeds to return an indication that the fastener set is consistent (operation 1534) with the process terminating thereafter. With reference again to operation 1532, if hole information is present, hole attributes are obtained (operation 1536). A determination is made as to whether the hole nominal size is equal to fastener nominal size (operation 1538). If the hole nominal size is equal to the fastener, a determination is made as to whether an appropriate class of fit is present (operation 1540).

If an appropriate class of fit is not present, the process proceeds to operation 1510. Otherwise, the process proceeds to operation 1534 as described above. With reference again to operation 1538, if the hole nominal size is not equal to fastener nominal size, the user is notified of the mismatch in sizing (operation 1542).

Thereafter, a determination is made as to whether the user has decided to override the mismatch identified by the process (operation 1544). If the user has decided to override the notification, the process proceeds to operation 1540. Otherwise, the process returns to operation 1510 as described above.

Figure 16A:
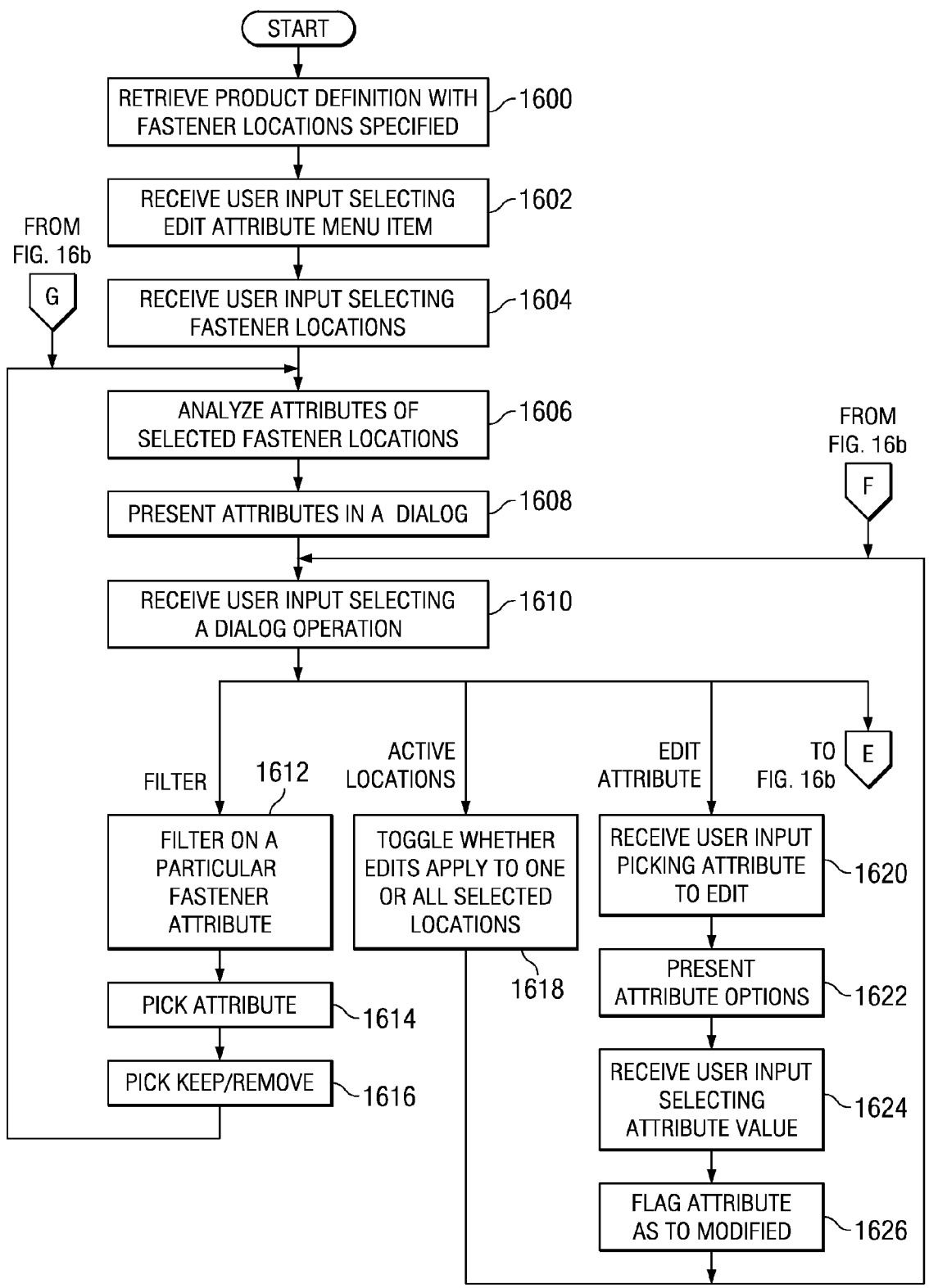

With reference next to FIGS. 16A and 16B, flowcharts of a process for editing attributes is depicted in accordance with an advantageous embodiment of the present invention. The process illustrated in FIGS. 16A and 16B may be implemented in a software component, such as fastener placement tool 302 in FIG. 3. This process is used to edit attribute information associated with a fastener.

In these examples, the editing provided in the process illustrated in FIGS. 16A and 16B is used to change an item or information in a product definition that has already been set. In the context of a fastener placement process, editing also may include adding and specifying new attributes. The overall user interface options provide flexibility to specify a fastener location, fastener hardware family, and other attributes in one step as described above, or to specify the location first and add attributes in a subsequent pass using the editing functions described below.

The editing process begins by retrieving the product definition with fastener locations specified (operation 1600). Thereafter, the process receives user input selecting an edit attribute menu item from the menu displayed by the placement tool (operation 1602). Next, the process receives user input selecting fastener locations (operation 1604). This input may be received from a user interface with a user selecting a fastener location in the product definition. Fastener locations may be selected by picking an element of the fastener location definition, such as the fastener pierce or breakout points from the screen. Alternatively, the user input may be selected through another mechanism, such as a tree structure that lists product definition features for particular components including fastener locations.

The process analyzes attributes of the selected fastener locations (operation 1606). In operation 1606, the process analyzes the attributes of selected fastener locations by organizing the data from the selected fastener locations and determining which attributes are the same and which attributes vary over the selected set of fastener locations. In these examples, for each attribute tool, operation 1606 determines whether all of the fasteners have the same attributes. If not all of the fasteners in the set of selected locations have the same attributes, the number of unique values represented is determined. Additionally, the most common value of the attributes also is identified.

The attributes are then presented to the user in a dialog (operation 1608). In operation 1608, the dialog presented to the user contains a complete set of attributes for one of the selected fastener locations in the set of fastener locations. Additionally, an indication of the variation across the selected set of fastener locations also is presented. If the selected set contains more than one fastener location, one is designated as the current fastener location for display and analysis purposes. The user may change which of the fastener locations is considered the current location. This current location is the one for which attributes are displayed. For each attribute, the variation may be displayed in different ways depending on the particular implementation.

In these examples, the dialog indicates whether or not all the locations have the same attributes. When the attributes are not the same at all locations, the dialog may indicate for each attribute how many locations have the same attribute value as the current location. For attributes such as size and grip, this dialog also may indicate the extreme values. The user is able to select different options from the dialog. These options include filter, set active locations, edit attributes, set current and apply in these examples.

User input selecting a dialog operation is received (operation 1610). If the dialog operation is "filter", a filter operation is performed on a particular fastener attribute (operation 1612). In operation 1612, the user can select a particular attribute value, and either keep only locations that have that value and remove all other locations from the list of selected locations, or remove locations that have that value from the list of selected locations. Therefore, the user can select a large number of fastener locations and filter to quickly obtain the locations that the user needs to edit.

When the attribute is filtered, user input picking an attribute is received (operation 1614). Thereafter, user input with respect to whether the attribute picked should be kept or removed is received (operation 1616). Thereafter, the process returns to operation 1606 to analyze the attributes of the selected fastener locations taking into account the change in the list of selected locations.

With reference now to operation 1610, if the dialog operation selected is "active locations", whether edits are applied to one or all selected locations are toggled (operation 1618). In operation 1618, attribute changes may be applied to either all selected fastener locations or only the current locations in these examples. Thereafter, the process returns to operation 1610.

With reference again to operation 1610, if the dialog operation selected is to "edit attribute", the process receives user input picking an attribute to edit (operation 1620). Thereafter, the process presents attribute options (operation 1622). The process then receives user input selecting an attribute value based on the presented options (operation 1624). The process then flags the attribute for modification (operation 1626) with the process then returning to operation 1610. These operations for editing attributes allow a user an ability to edit attributes for the fasteners and have these changes applied to all active locations later when modified attributes are applied as described below with respect to operation 1638.

If in operation 1610, the dialog operation selected is "set current", user input is received selecting the current fastener location (operation 1628) with the process then returning to operation 1606. Operation 1628 is used to specify the location in the list of selected locations that is the current location and display the attribute values for the current location.

Another dialog operation that may be selected in operation 1610 is "apply". When this operation is selected, a determination is made as to which locations are active (operation 1630). If multiple locations are active, all of the selected fastener locations to the active list are added (operation 1631) and the process proceeds to operation 1632. With reference again to operation 1630, if only the current location is active, the current location is added to the active list and all other locations are removed from the list (operation 1633) and then the process proceeds to operation 1632. The next fastener location in the active list is obtained in (operation 1632). A consistency check is applied (operation 1634). Next, a determination is made as to whether consistency is acceptable (operation 1636). If consistency is acceptable, the modified attributes are applied to the fastener location (operation 1638).

Thereafter, a determination is made as to whether more active locations are present for processing that have not yet been processed (operation 1640). If additional locations are not present, the process returns to operation 1610. Otherwise, the process proceeds to operation 1632 to obtain the next active fastener location for processing. As can be seen, the operations for this particular option are used to update the modified attributes for the different active locations. With reference again to operation 1636, if consistency is not acceptable, the process proceeds to operation 1640 as described above.

Figure 17:
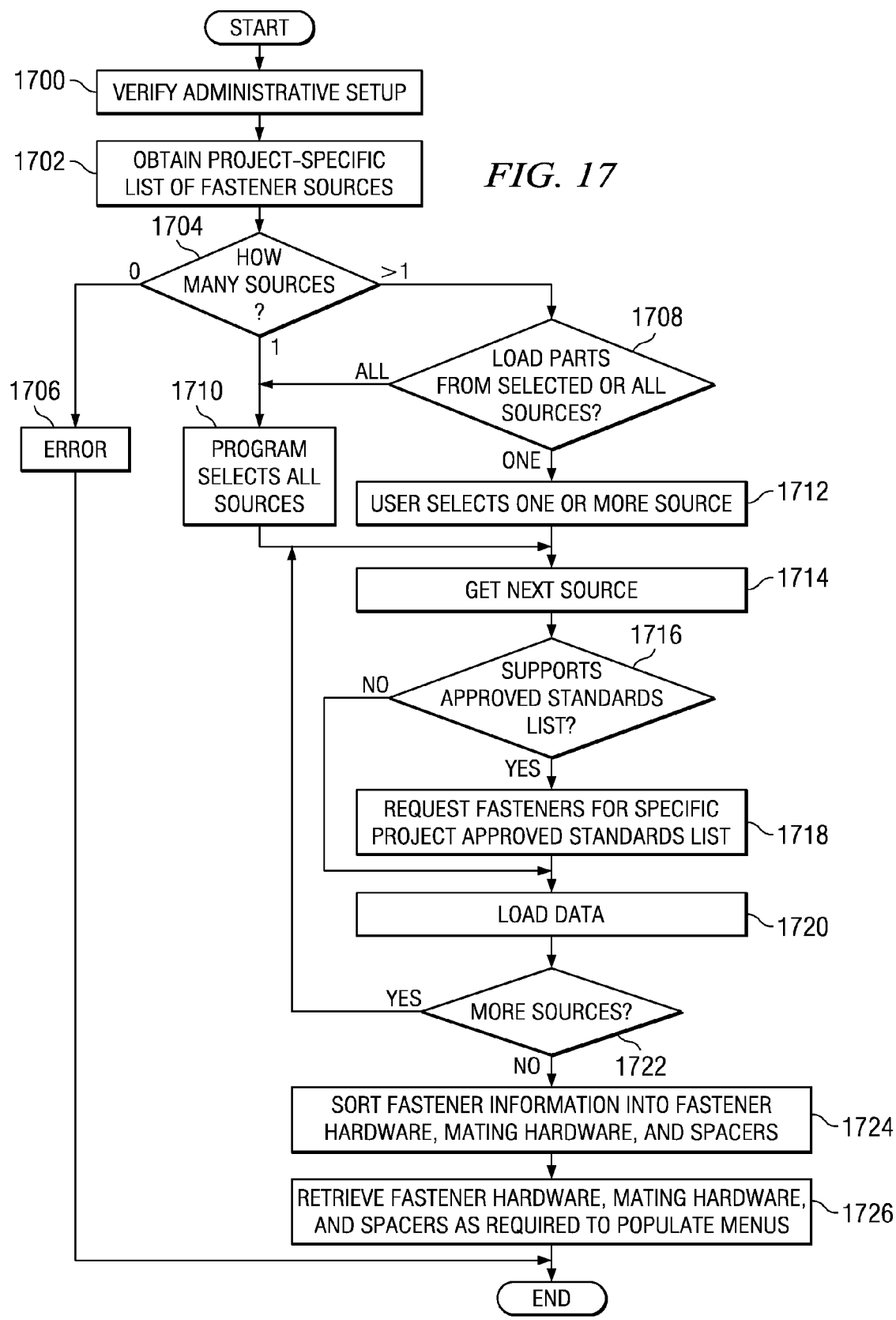
FIG. 17 is a flowchart of a process for loading fastener data in accordance with an advantageous embodiment of the present invention.

Turning now to FIG. 17, a flowchart of a process for loading fastener data is depicted in accordance with an advantageous embodiment of the present invention. The process illustrated in FIG. 17 may be implemented in a fastener placement tool, such as fastener placement tool 302 in FIG. 3.

The process begins by verifying the administrative setup (operation 1700). Operation 1700 may be implemented using the process illustrated in FIG. 12. Thereafter, a project specific list of fastener sources is obtained (operation 1702). A determination is then made as to how many sources are present (operation 1704). If sources are not present, an error is generated and the process terminates (operation 1706). If more than one source is present, the user is queried whether to load parts from all or selected sources (operation 1708). If the determination is to use all sources, all of the sources are selected (operation 1710). If only one source is present in operation 1704, the process proceeds directly to operation 1710. If the determination is to use only selected sources in operation 1708, the user selects one or more sources in (operation 1712).

Thereafter, the next unprocessed source is obtained (operation 1714). A determination is made as to whether the source supports an approved standards list (ASL) (operation 1716). An individual source may or may not support approved standards lists. If the source selected supports an approved standards list, the fasteners for the specific project approved standards list are requested (operation 1718). The data is then loaded (operation 1720). Referring back to the determination made in operation 1716, if the source selected does not support an approved standards list, the process proceeds directly to operation 1720.

A determination is then made as to whether additional sources are present (operation 1722). If additional sources are present, the process returns to operation 1714. Otherwise, the process sorts fastener information into fastener hardware, mating hardware, and spacers (operation 1724). The sorted fastener information is stored in a data manager, such as session data manager 307 in FIG. 3.

Thereafter, fastener hardware, mating hardware, and spacers are retrieved from the data manager as required to populate the menus for the placement tool (operation 1726) with the process terminating thereafter. The information retrieval in operation 1726 is performed whenever a menu containing fastener data is to be displayed or updated.

Turning now to FIG. 18, a flowchart of a process for knowledge based guidance is depicted in accordance with an advantageous embodiment of the present invention. The process illustrated in FIG. 18 may be implemented in a fastener placement tool, such as fastener placement tool 302 in FIG. 3 to work with a knowledge based system, such as knowledge based system 326 in FIG. 3.

The process begins by receiving a user request for knowledge based guidance (operation 1800). In response to receiving this request, the process sends basic information to the knowledge base (operation 1802). In these examples, the basic information includes, for example, the project, a diameter, stackup thickness, and material type. Stackup refers to the material being fastened and the stackup thickness is the distance between the pierce point and the breakout point. The stackup thickness plus the thickness of any washers or other spacers determines the grip length. This information is sent in a message.

In order to send messages between the fastener placement process and a knowledge base such as the knowledge-based system 326 illustrated in FIG. 3, a language or protocol are required. Many existing message passing schemes are available, such as extensible markup language (XML), and protocols, such as hypertext markup language (HTML). Virtually any language or protocol may be used as long as the sender and receiver agree and understand each others messages.

In response to sending the basic information to the knowledge base, a message is received from the knowledge base (operation 1804). A determination is made as to the type of the message (operation 1806). Messages can be classified a number of ways. In these examples, the process distinguishs between three types; a query which request more information, an error which identifies a problem, and fastener information, such as part numbers for a fastener or fastener set. If the message is a query, the query is presented to the user (operation 1808). Thereafter, a user input responding to the query is received (operation 1810). The user input is then returned to the knowledge base (operation 1812) with the process returning to operation 1804 as described above.

With reference again to operation 1806, if a message indicating an error is received, the process terminates. If the determination of the message type is fastener information, the fastener data is set (operation 1814) with the process terminating thereafter. In operation 1814, the knowledge base may provide individual items or a fastener set for use in setting the fastener data in operation 1814.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

Although the depicted embodiments are illustrated with respect to aerospace vehicles, the computer implemented method, apparatus, and computer usable program code for placing fasteners in a product definition may be applied to product definitions other than those for aerospace vehicles. For example, the different advantageous embodiments may be applied to place fasteners in other designs, such as automobiles, trucks, boats, submarines, and motorcycles. Further, the placement of fasteners may be applied to other product definitions other than vehicles. For example, the different embodiments may be applied to the placement of fasteners for designs, such as elevators, buildings, and manufacturing tools.

The description of the present invention has been presented for purposes of illustration and description, and is not intended to be exhaustive or limited to the invention in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the invention, the practical application, and to enable others of ordinary skill in the art to understand the invention for various embodiments with various modifications as are suited to the particular use contemplated.

What is claimed is:

1. A computer implemented method for placing fasteners in a three dimensional product definition, the computer implemented method comprising:

receiving as input by a computer a first user input selecting a fastener to fasten a set of components in a three dimensional product definition to form a selected fastener, wherein the three dimensional product definition uses model-based definition in which parameters describing components are included in the three dimensional product definition;

receiving as input by the computer a second user input defining a point on the set of components in the three dimensional product definition to form a defined point, wherein the defined point is a point at which the fastener is to be positioned;

determining using the computer whether the selected fastener is acceptable for use in fastening the set of components utilizing a policy;

responsive to a determination that the selected fastener is acceptable, identifying using the computer a breakout point on the set of components using the defined point to form a location for the fastener, wherein the breakout point is a particular point along a vector, originating from the defined point, at which the vector exits the set of components; and placing automatically by the computer the selected fastener into the location in the three dimensional product definition without placing a corresponding hole for the selected fastener in the three dimensional product definition while automatically placing the selected fastener into the location in the three dimensional product definition, and wherein no hole modeling information is generated for the defined point in the three dimensional product definition prior to and during placing automatically the selected fastener into the location in the three dimensional product definition.

2. The computer implemented method of claim 1, wherein the second user input is a list of points for the set of components in which the point is one of the points in the list and wherein the receiving and placing step is performed for each point in the list of points.

3. The computer implemented method of claim 1, wherein the placing step further comprises:
   determining a vector needed for orienting the fastener to a normal to a surface;
   determining a grip length needed for the fastener;
   identifying a mating part needed for the fastener to form an identified mating part;
   identifying a spacer needed for the fastener to form an identified spacer; and
   placing the identified spacer and the identified mating part into the location with the fastener.

4. The computer implemented method of claim 1, wherein the placing step further comprises:
   identifying a grip length for the fastener to form an identified grip length; and
   adding the identified grip length to the location.

5. The computer implemented method of claim 1 further comprising:
   responsive to a determination that the selected fastener is unacceptable for use in the three dimensional product definition, requesting by the computer additional user input to the computer to define another fastener for the location.

6. The computer implemented method of claim 1 further comprising:
   responsive to a request for the three dimensional product definition, retrieving the three dimensional product definition using a product data manager, wherein the product data manager is implemented in the computer and stores and retrieves three dimensional product definitions without requiring a requester to include a location for the three dimensional product definition in the request.

7. The computer implemented method of claim 1 further comprising:
   controlling access to projects and project options used to place fasteners using a key file in the computer, wherein the key file specifies a list of projects and project options that may be used.

8. The computer implemented method of claim 7, wherein the three dimensional product definition is associated with a project and wherein the key file is used to identify criteria for determining whether the selected fastener is acceptable for use in the three dimensional product definition.

9. The computer implemented method of claim 1, wherein the placing step comprises:
   retrieving a separate three dimensional model for the selected fastener; and
   placing the separate three dimensional model for the selected fastener into the location.

10. The computer implemented method of claim 1 further comprising:
    representing using the computer the engineering intent to define and place sets of fastener hardware using model-based definition without a geometrical representation of fastener parts or a hole by the computer.

11. The computer implemented method of claim 1, wherein the fastener is a fastener set.

12. A computer implemented method for placing fasteners in a three dimensional product definition, the computer implemented method comprising:
    identifying a fastener from a plurality of different fasteners to fasten a set of components in a three dimensional product definition using a policy to form a selected fastener;
    receiving as input by the computer a set of points on the set of components for which fasteners are to be placed to form a set of defined points;
    generating by the computer a set of locations in the set of components in the three dimensional product definition using the set of defined points to form a set of defined locations; and
    placing automatically by the computer the selected fastener into the set of defined locations in the three dimensional product definition without placing a corresponding hole for the selected fastener in the three dimensional product definition while automatically placing the selected fastener into the set of defined locations in the three dimensional product definition, and wherein no hole modeling information is generated for the set of defined points in the three dimensional product definition prior to and during placing automatically the selected fastener into the set of defined locations in the three dimensional product definition.

13. The computer implemented method of claim 12, wherein the identifying step comprises:
    receiving as input by the computer a user input selecting the fastener from a plurality of different fasteners; and
    responsive to receiving the user input, determining using the computer whether the fastener is appropriate for use in fastening the set of components in the three dimensional product definition using a policy.

14. The computer implemented method of claim 12, wherein the receiving step comprises:
    receiving as input by the computer a user defining the set of points on the set of components in the three dimensional product definition to form the set of defined points, wherein a defined point is a point at which the selected fastener is to be inserted.

15. The computer implemented method of claim 14, wherein the generating step comprises:
    identifying using the computer a breakout point on the set of components for each defined point in the set of defined points to form a set of breakout points, wherein the breakout point is a particular point along a vector, originating from a defined point, exits the set of components; and
    forming by the computer the set of defined locations using the set of defined points and the set of breakout points.

16. The computer implemented method of claim 12, wherein the three dimensional product definition uses model-based definition in which parameters describing components are included in the three dimensional product definition.

17. A computer program product comprising:
    a non-transitory computer usable medium having computer usable program code for placing fasteners in a three dimensional product definition, the computer useable medium comprising:
    computer usable program code for identifying a fastener from a plurality of different fasteners to fasten a set of components in a three dimensional product definition using a policy to form a selected fastener;

computer usable program code for receiving a set of points on the set of components for which fasteners are to be placed to form a set of defined points;

computer usable program code for generating a set of locations in the set of components in the three dimensional product definition using the set of defined points to form a set of defined locations; and computer usable program code for placing the selected fastener into the set of defined locations in the three dimensional product definition without placing a corresponding hole for the selected fastener in the three dimensional product definition while automatically placing the selected fastener into the set of defined locations in the three dimensional product definition, and wherein no hole modeling information is generated for the set of defined points in the three dimensional product definition prior to and during placing automatically the selected fastener into the set of defined locations in the three dimensional product definition.

18. The computer program product of claim 17, wherein the computer usable program code for identifying a fastener from a plurality of different fasteners to fasten a set of components in a three dimensional product definition using a policy to form a selected fastener comprises:

computer usable program code for receiving a user input selecting the fastener from a plurality of different fasteners; and computer usable program code, responsive to receiving the user input, for determining whether the fastener is appropriate for use in fastening the set of components in the three dimensional product definition using a policy.

19. The computer program product of claim 17, wherein the computer usable program code for receiving a set of points on the set of components for which fasteners are to be placed to form a set of defined points comprises:

computer usable program code for receiving a user input defining the set of points on the set of components in the three dimensional product definition to form the set of defined points, wherein a defined point is a point at which the selected fastener is to be inserted.

20. The computer program product of claim 17, wherein the computer usable program code for generating a set of locations in the set of components in the three dimensional product definition using the set of defined points to form a set of defined locations comprises:

computer usable program code for identifying a breakout point on the set of components for each defined point in the set of defined points to form the set of defined locations, wherein the breakout point is a particular point along a vector, originating from a defined point, at a location where the vector exits the set of components.

21. A data processing system comprising:

a bus;

a communications unit connected to the bus;

a storage device connected to the bus, wherein the storage device includes computer usable program code; and a processor unit connected to the bus, wherein the processor unit executes the computer usable program code to receive a first user input selecting a fastener to fasten a set of components in a three dimensional product definition to form a selected fastener, wherein the three dimensional product definition uses model-based definition in which parameters describing components are included in the three dimensional product definition; receive a second user input defining a point on the set of components in the three dimensional product definition to form a defined point, wherein the defined point is a point at which the fastener is to be positioned; determine whether the selected fastener is acceptable for use in fastening the set of components utilizing a policy; identify a breakout point on the set of components using the defined point to form a location for the fastener in response to a determination that the selected fastener is acceptable, wherein the breakout point is a particular point along a vector, originating from the defined point, at which the vector exits the set of components; and place the selected fastener into the location in the three dimensional product definition without placing a corresponding hole for the selected fastener in the three dimensional product definition while automatically placing the selected fastener into the location in the three dimensional product definition, and wherein no hole modeling information is generated for the defined point in the three dimensional product definition prior to and during placing automatically the selected fastener into the location in the three dimensional product definition.

* * * * *